United States Patent
Fujita et al.

(10) Patent No.: US 11,087,977 B2
(45) Date of Patent: Aug. 10, 2021

(54) P-TYPE OXIDE SEMICONDUCTOR AND METHOD FOR MANUFACTURING SAME

(71) Applicants: FLOSFIA INC., Kyoto (JP); KYOTO UNIVERSITY, Kyoto (JP)

(72) Inventors: Shizuo Fujita, Kyoto (JP); Kentaro Kaneko, Kyoto (JP); Masaya Oda, Kyoto (JP); Toshimi Hitora, Kyoto (JP)

(73) Assignees: FLOSFIA INC, Kyoto (JP); KYOTO UNIVERSITY, Kyoto (JP)

( * ) Notice: Subject to any disclaimer, the term of this patent is extended or adjusted under 35 U.S.C. 154(b) by 0 days.

(21) Appl. No.: 16/326,569

(22) PCT Filed: Aug. 29, 2017

(86) PCT No.: PCT/JP2017/031007
§ 371 (c)(1),
(2) Date: Feb. 19, 2019

(87) PCT Pub. No.: WO2018/043503
PCT Pub. Date: Mar. 8, 2018

(65) Prior Publication Data
US 2019/0189441 A1   Jun. 20, 2019

(30) Foreign Application Priority Data

Aug. 31, 2016  (JP) .............................. JP2016-170330
Sep. 24, 2016  (JP) .............................. JP2016-186343

(51) Int. Cl.
*H01L 21/02* (2006.01)
*C23C 16/40* (2006.01)
(Continued)

(52) U.S. Cl.
CPC ........ *H01L 21/02565* (2013.01); *C23C 16/40* (2013.01); *C23C 16/448* (2013.01);
(Continued)

(58) Field of Classification Search
None
See application file for complete search history.

(56) References Cited

U.S. PATENT DOCUMENTS 4,103,415 A * 8/1978 Hayes ............... H01L 21/32105
148/DIG. 106
5,763,655 A    6/1998 Patois et al.
(Continued)

FOREIGN PATENT DOCUMENTS

JP      8-227793      9/1996
JP      9-25255       1/1997
(Continued)

OTHER PUBLICATIONS

International Search Report issued Dec. 5, 2017 in International (PCT) Application No. PCT/JP2017/031007.
(Continued)

*Primary Examiner* — Anthony Ho
*Assistant Examiner* — Kevin Quinto
(74) *Attorney, Agent, or Firm* — Wenderoth, Lind & Ponack, L.L.P.

(57) ABSTRACT

A new and useful p-type oxide semiconductor with a wide band gap and an enhanced electrical conductivity and the method of manufacturing the p-type oxide semiconductor are provided. A method of manufacturing a p-type oxide semiconductor including: generating atomized droplets by atomizing a raw material solution including iridium and a metal that is different from iridium and optionally contained; carrying the atomized droplets onto a surface of a base by using a carrier gas; causing a thermal reaction of the atomized droplets adjacent to the surface of the base to form a crystal or a mixed crystal of a metal oxide including iridium.

8 Claims, 12 Drawing Sheets

(51) Int. Cl.
| | |
|---|---|
| *H01L 29/872* | (2006.01) |
| *H01L 33/26* | (2010.01) |
| *H01L 29/24* | (2006.01) |
| *C23C 16/448* | (2006.01) |
| *H01L 29/78* | (2006.01) |
| *H01L 29/808* | (2006.01) |
| *H01L 29/778* | (2006.01) |
| *H01L 29/737* | (2006.01) |
| *H01L 29/739* | (2006.01) |
| *H01L 29/812* | (2006.01) |
| *H01L 29/12* | (2006.01) |
| *H01L 29/04* | (2006.01) |
| *H01L 29/66* | (2006.01) |
| *H01L 29/423* | (2006.01) |

(52) U.S. Cl.
CPC ...... *C23C 16/4486* (2013.01); *H01L 21/0262* (2013.01); *H01L 29/04* (2013.01); *H01L 29/12* (2013.01); *H01L 29/24* (2013.01); *H01L 29/66969* (2013.01); *H01L 29/737* (2013.01); *H01L 29/739* (2013.01); *H01L 29/7371* (2013.01); *H01L 29/7395* (2013.01); *H01L 29/778* (2013.01); *H01L 29/7787* (2013.01); *H01L 29/78* (2013.01); *H01L 29/7827* (2013.01); *H01L 29/808* (2013.01); *H01L 29/8083* (2013.01); *H01L 29/812* (2013.01); *H01L 29/872* (2013.01); *H01L 33/26* (2013.01); *H01L 29/4236* (2013.01)

(56) References Cited

U.S. PATENT DOCUMENTS

| | | | | |
|---|---|---|---|---|
| 5,989,785 | A | 11/1999 | Ishihara et al. | |
| 6,362,034 | B1* | 3/2002 | Sandford | ........ H01L 21/823814 257/E21.634 |
| 2002/0004248 | A1* | 1/2002 | Lee | ......................... H01L 28/55 438/3 |
| 2003/0157774 | A1* | 8/2003 | Tominari | ............. H01L 21/8249 438/312 |
| 2005/0128255 | A1* | 6/2005 | Nakanishi | ............... B41J 2/1646 347/68 |
| 2007/0114528 | A1 | 5/2007 | Herman et al. | |
| 2010/0155854 | A1* | 6/2010 | Stahrenberg | .... H01L 21/823828 257/392 |
| 2011/0292487 | A1* | 12/2011 | Noh | ......................... G02F 1/15 359/265 |
| 2013/0056691 | A1* | 3/2013 | Ryu | ...................... C01B 19/002 252/519.4 |
| 2014/0332823 | A1* | 11/2014 | Takizawa | .......... H01L 21/02414 257/76 |
| 2015/0001535 | A1 | 1/2015 | Asami et al. | |

FOREIGN PATENT DOCUMENTS

| | | |
|---|---|---|
| JP | 11-21687 | 1/1999 |
| JP | 2005-340308 | 12/2005 |
| JP | 2007-081231 | 3/2007 |
| JP | 2013-58637 | 3/2013 |
| JP | 2013-058637 | 3/2013 |
| JP | 2013-165189 | 8/2013 |
| JP | 2013-234106 | 11/2013 |
| JP | 2016-25256 | 2/2016 |
| JP | 2016-81946 | 5/2016 |
| KR | 10-2016-0093510 | 8/2016 |

OTHER PUBLICATIONS

Kentaro Kaneko, "Growth and Physical Properties of Corundum-Structured Gallium Oxide Alloy Thin Films", Dissertation, Kyoto Univ., pp. 1-113, Mar. 2013 with English Abstract.

Takemoto Tatsuya, EE Times, Japan, "Power Semiconductor Gallium Oxide" Thermal Conductivity, P-type . . . Overcoming Issues and Putting it into Practical Use. [Online], Retrieved Jun. 21, 2016, from http://eetimes.jp/ee/articles/1402/27/news028_2.html, with Machine Translation.

F.P. Koffyberg, "Optical Bandgaps and Electron Affinities of Semiconducting $Rh_2O_3(I)$ and $Rh_2O_3(III)$", J. Phys. Chem. Solids, vol. 53, No. 10, pp. 1285-1288, 1992.

Hideo Hosono, "Functional Development of Oxide Semiconductor" Physics Research, Electronic version, vol. 3, No. 1, 031211 (Merger issue of Sep. 2013 and Feb. 2014), with Machine Translation.

R. K. Kawar et al., "Substrate temperature dependent structural, optical and electrical properties of spray deposited iridium oxide thin films", Applied Surface Science, vol. 206, pp. 90-101, 2003.

Notice of Reasons for Refusal dated May 25, 2021 in corresponding Japanese Application Serial No. 2018-537303 with English translation.

* cited by examiner

P-TYPE OXIDE SEMICONDUCTOR AND METHOD FOR MANUFACTURING SAME

TECHNICAL FIELD

The present invention relates to a p-type oxide semiconductor. Also, the present invention relates to a method for manufacturing a p-type oxide semiconductor. The present invention also relates to a semiconductor device including a p-type oxide semiconductor. Furthermore, the present invention relates to a semiconductor system including a p-type oxide semiconductor.

BACKGROUND ART

As a switching device of the next generation achieving high withstand voltage, low losses, and high temperature resistance, semiconductor devices using gallium oxide ($Ga_2O_3$) with a large band gap attract attention and are expected to be applied to power semiconductor devices including an inverter. Also, gallium oxide is expected to be applied to a light emitting and receiving element such as a light emitting diode (LED) and a sensor, since gallium oxide has a wide band gap. According to NPL 1, such gallium oxide has a band gap that may be controlled by forming mixed crystal with indium or aluminum singly or in combination and such a mixed crystal is extremely attractive materials as InAlGaO-based semiconductors. Here, InAlGaO-based semiconductors refers to $In_XAl_YGa_ZO_3$ ($0 \leq X \leq 2$, $0 \leq Y \leq 2$, $0 \leq Z \leq 2$, $X+Y+Z=1.5~2.5$) and can be viewed as the same material system containing gallium oxide.

In recent years, gallium oxide based p-type semiconductors have been studied. For example, PTL 1 describes a base showing p-type conductivity to be obtained by forming a $\beta$-$Ga_2O_3$ based crystal by floating zone method using MgO (p-type dopant source). Also, PTL 2 discloses to form a p-type semiconductor by using an ion implantation of p-type dopant into $\alpha$-$(Al_XGa_{1-X})_2O_3$ single crystalline film obtained by Molecular Beam Epitaxy (MBE) method. However, NPL2 discloses that a p-type semiconductor was not obtained by the methods disclosed in PTLs 1 and 2 (NPL2). In fact, there has been no reports of any success in forming a p-type semiconductor by use of the methods disclosed in PTLs 1 and 2. Therefore, p-type oxide semiconductor and a method of manufacturing a p-type oxide semiconductor have been desired to be realized.

Also, NPLs 3 and 4 disclose that for example, a use of $Rh_2O_3$ or $ZnRh_2O_4$ as a p-type semiconductor has been considered. Nevertheless, $Rh_2O_3$ has a problem with a raw material that tends to be low in concentration especially in film forming process, and a low concentration of the raw material affects forming films. In addition, it has been difficult to produce a single crystal of $Rh_2O_3$ even if using an organic solvent. Also, even though Hall effect measurement was conducted, $Rh_2O_3$ and $ZnRh_2O_4$ were not determined to be p-type or the measurement itself might not be well done. Further, for example, Hall coefficient of these semiconductors were measurement limit (0.2 $cm^3$/C) or less that was not useful at all. Also, since $ZnRh_2O_4$ has a low mobility and a narrow band gap, $ZnRh_2O_4$ cannot be used as LED or power devices. Therefore, $Rh_2O_3$ and $ZnRh_2O_4$ were not necessarily satisfactory.

As a wide band gap semiconductor besides $Rh_2O_3$ and $ZnRh_2O_4$, various p-type oxide semiconductors have been investigated. PTL3 discloses that delafossite or oxychalcogenide are used as p-type semiconductor. However, the semiconductor using delafossite or oxychalcogenide has a mobility of as low as 1 $cm^2$/Vs or less and insufficient electrical properties and thus, the semiconductor using delafossite or oxychalcogenide could not form a p-n junction properly with a next generation n-type oxide semiconductor such as $\alpha$-$Ga_2O_3$.

Also, $Ir_2O_3$ has been conventionally known, for example, to be used as an iridium catalyst as disclosed in PTL 4, and PTL 5 discloses $Ir_2O_3$ is used as a dielectric, and PTL 6 discloses that $Ir_2O_3$ is used as an electrode. However, $Ir_2O_3$ never been known to be used as a p-type semiconductor.

CITATION LIST

Patent Literature

PTL 1: JP2005-340308A
PTL 2: JP2013-58637A
PTL 3: JP2016-25256A
PTL 4: JPH09-25255A
PTL 5: JPH08-227793A
PTL 6: JPH11-21687A

Non Patent Literature

NPL 1: Kaneko, Kentaro, "Fabrication and physical properties of corundum structured alloys based on gallium oxide", Dissertation, Kyoto Univ., March 2013

NPL 2: Tatsuya, Takemoto, EE Times, Japan "power device gallium oxide" Thermal conductivity, p-type overcoming issues and putting it into practical use. [online], Retrieved Jun. 21, 2016, from http://eetimes.jp/ee/articles/1402/27/news028_2.html NPL 3: F. P. KOFFYBERG et al., "optical bandgaps and electron affinities of semiconducting Rh2O3(I) and Rh2O3(III)", J. Phys. Chem. Solids Vol. 53, No. 10, pp. 1285-1288, 1992

NPL 4: Hideo Hosono, "Functional development of oxide semiconductor" Physics Research, Electronic version, Vol. 3, No. 1, 031211 (Merger issue of September 2013 and February 2014)

SUMMARY OF INVENTION

Technical Problem

It is an object of a present inventive subject matter to provide a new and useful p-type oxide semiconductor with a wide band gap and an enhanced electrical conductivity. It is also an object of a present inventive subject matter to provide a method of manufacturing the p-type oxide semiconductor.

Solution to Problem

As a result of keen examination to achieve the object, the present inventors found that a p-type oxide semiconductor with a wide bandgap that is 2.4 eV or more and an enhanced electrical conductivity that is 2 $cm^2$/Vs or more in hole mobility is obtainable by a method including; generating atomized droplets by atomizing a raw material solution containing iridium; carrying the atomized droplets onto a surface of a base by using a carrier gas; and causing a thermal reaction of the atomized droplets adjacent to the surface of the base to form a film of a crystal of metal oxide containing iridium on the base. Furthermore, the present inventors found that the obtained p-type oxide semiconductor is useful for semiconductor devices using wide band gap semiconductors that includes gallium oxide ($Ga_2O_3$). The present inventors further found that the p-type oxide semiconductor that the present inventors obtained, and the method of manufacturing the p-type oxide semiconductor are capable of solving the conventional problems mentioned above.

After learning the above findings, the present inventors have made further research to complete the present invention. That is, the present invention relates to the followings.

[1] A method of manufacturing a p-type oxide semiconductor including: generating atomized droplets by atomizing a raw material solution including iridium and optionally including a metal that is different from iridium; carrying the atomized droplets onto a surface of a base by using a carrier gas; and causing a thermal reaction of the atomized droplets adjacent to the surface of the base to form a crystal of a metal oxide including iridium or a mixed crystal of a metal oxide including iridium on the base.

[2] The method according to [1] above, wherein the raw material solution includes iridium and the metal that is different from iridium, and wherein the metal includes a metal selected from a metal of Group 2 of the periodic table, a metal except iridium of Group 9 of the periodic table, and a metal of Group 13 of the periodic table.

[3] The method of [1] or [2], wherein the thermal reaction is conducted under an atmospheric pressure.

[4] The method of [1] to [3], wherein the base is a substrate including a corundum structure.

[5] A p-type oxide semiconductor including: a crystalline oxide semiconductor as a major component, the crystalline oxide semiconductor including a crystal of a metal oxide that includes iridium or the crystalline oxide semiconductor including a mixed crystal of a metal oxide that incudes iridium.

[6] The p-type oxide semiconductor of [5], wherein the metal oxide includes $Ir_2O_3$.

[7] The p-type oxide semiconductor of [5] or [6], wherein the crystalline oxide semiconductor includes the mixed crystal comprising iridium and a metal selected from among a metal of Group 2 of the periodic table, a metal except iridium of Group 9 of the periodic table, and a metal of Group 13 of the periodic table.

[8] The p-type oxide semiconductor of [5] to [7], wherein the crystalline oxide semiconductor includes a corundum structure or a β-gallia structure.

[9] The p-type oxide semiconductor including: a crystalline oxide semiconductor as a major component with a band gap that is 2.4 eV or more.

[10] A semiconductor device including: a semiconductor layer including the p-type oxide semiconductor of [5] to [9]; and an electrode.

[11] The semiconductor device of [10], further including: an n-type semiconductor layer including an oxide semiconductor as a major component.

[12] The semiconductor device of [11], wherein the n-type semiconductor layer includes as the major component the oxide semiconductor including a metal of Group 2 of the periodic table, a metal of Group 9 of the periodic table, or a metal of Group 13 of the periodic table.

[13] The semiconductor device of [11] or [12], wherein a difference in lattice constants between the oxide semiconductor comprised as the major component in the n-type semiconductor layer and the p-type oxide semiconductor is 1.0% or less.

[14] The semiconductor device of [11] to [13], wherein the n-type semiconductor layer includes as a major component a crystalline oxide semiconductor including gallium (Ga).

[15] The semiconductor device of [10] to [14], wherein the semiconductor device is a heterojunction bipolar transistor (HBT).

[16] A method of manufacturing the semiconductor device of [11] to [19] including: arranging the p-type semiconductor layer on the n-type semiconductor layer, wherein the p-type semiconductor layer includes as a major component the p-type oxide semiconductor of [5] to [9].

[17] The method of [16], wherein the n-type semiconductor layer includes as a major component an oxide semiconductor, and wherein a difference in lattice constants between the oxide semiconductor included in the n-type semiconductor layer and the p-type oxide semiconductor is 1.0% or less.

[18] The method of [16] or [17], wherein the n-type semiconductor layer includes as a major component a crystalline oxide semiconductor including gallium (Ga).

[19] A semiconductor system comprising: the semiconductor device of [10] to [15].

[20] A method of manufacturing an oxide semiconductor including: forming a crystal of a metal oxide including iridium or a mixed crystal of a metal oxide including iridium by the growth of the crystal or the mixed crystal, using a raw material including iridium and optionally including a metal that is different from iridium, directly on a base comprising a corundum structure or on the base through at least a layer.

[21] The method of [20], wherein the raw material includes halogenated iridium.

Advantageous Effects of Invention

A p-type oxide semiconductor according to a present inventive subject matter is obtained to have a wide band gap, and an enhanced electrical conductivity showing an enhanced semiconductor properties as a p-type semiconductor. Also, a method according to a present inventive subject matter is capable of producing the type oxide semiconductor industrially advantageously.

DETAILED DESCRIPTION

Figure 1:
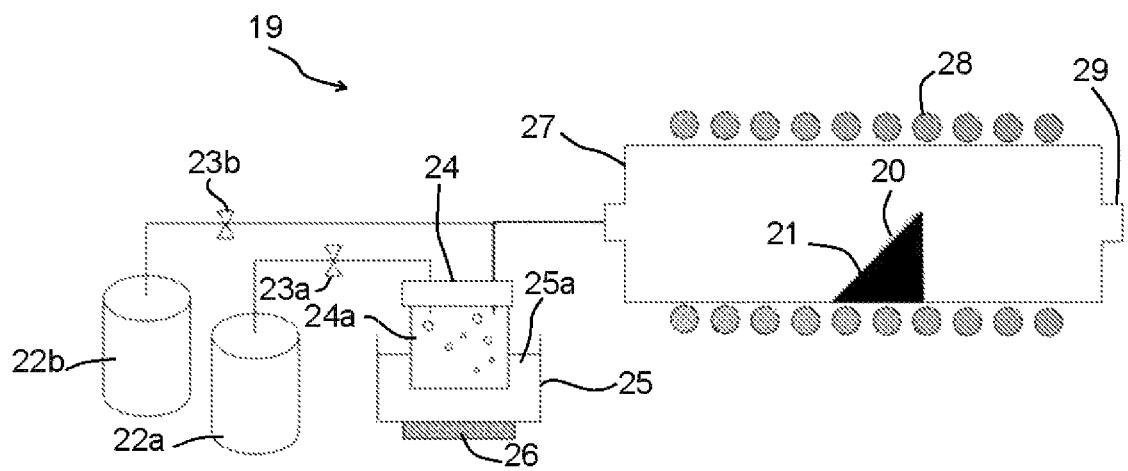
FIG. 1 shows a schematic diagram of a mist chemical vapor deposition (CVD) apparatus that may be used according to an embodiment of the present inventive subject matter.

Hereinafter, embodiments of the present inventive subject matter will be described in detail.

A p-type semiconductor of the present inventive subject matter includes a p-type oxide semiconductor containing a crystalline oxide semiconductor as a major component and the crystalline oxide semiconductor contains a crystal of a metal oxide containing iridium (Ir) or a mixed crystal of a metal oxide containing iridium (Ir). The term "major component" herein means that the p-type oxide semiconductor contains the crystalline oxide semiconductor that is contained as the major component is preferably to be 50% or more at atomic ratio in all components contained in the p-type oxide semiconductor. According to an embodiment of the present inventive subject matter, the p-type oxide semiconductor contains the crystalline oxide semiconductor that may be preferably 70% or more at atomic ratio in all components in the p-type oxide semiconductor. For the present inventive subject matter, the p-type oxide semiconductor contains the crystalline oxide semiconductor that may be further preferably 90% or more at atomic ratio in all components in the p-type oxide semiconductor. The p-type oxide semiconductor may contain the crystalline oxide semiconductor that is 100% at atomic ratio in all components in the p-type oxide semiconductor. The crystalline oxide semiconductor is not particularly limited if the crystalline oxide semiconductor contains a crystal or a mixed crystal of the metal oxide containing iridium. The term "metal oxide containing iridium" herein means a material containing iridium and oxygen. According to an embodiment of the present inventive subject matter, the metal oxide containing iridium may be preferably $Ir_2O_3$ and may be further preferably $\alpha\text{-}Ir_2O_3$. Also, if the crystalline oxide semiconductor contains the mixed crystal, the mixed crystal contained in the crystalline oxide semiconductor may preferably contain iridium and a metal selected from among a metal of Group 2 of the periodic table, a metal except iridium of Group 9 of the periodic table and a metal of Group 13 of the periodic table. The above-mentioned p-type oxide semiconductor of the present inventive subject matter is obtained to have a mobility of 2 $cm^2$/Vs or more, and a band gap of 2.4 eV or more and thus, useful with a wide band gap and enhanced electrical properties as a p-type oxide semiconductor.

The term "the periodic table" herein means the periodic table defined by the International Union of Pure and Applied Chemistry (IUPAC). The term "metal of Group 2" means a metal of Group 2 of the periodic table. Examples of the metal of Group 2 of the periodic table include beryllium (Be), magnesium (Mg), calcium (Ca), strontium (Sr), barium (Ba), and a combination of two or more of metals of Group 2. The term "metal except iridium of Group 9" means a metal selected from among metals except iridium of Group 9 of the periodic table. Examples of the metal of Group 9 include cobalt (Co), rhodium (Rh), and a combination of two or more metals thereof. The term "metal of Group 13" is not particularly limited as long as the metal belongs to Group 13 of the periodic table. Examples of the metal of Group 13 of the periodic table include aluminum (Al), gallium (Ga), indium (In), thallium (Ta), and a combination of two or more metals thereof. According to an embodiment of the present inventive subject matter, the metal preferably includes at least one metal selected from among aluminum (Al), gallium (Ga), and indium (In).

Examples of the crystalline oxide semiconductor include a crystal of the metal oxide containing iridium and a mixed crystal of the metal oxide containing iridium, and the content ratio of the metal oxide contained in the crystalline oxide semiconductor is not particularly limited as long as an object of the present inventive subject matter is not interfered with, however, according to an embodiment of the present inventive subject matter, the content ratio of the metal oxide in the crystalline oxide semiconductor is preferably 50% or more at atomic ratio in all components in the crystalline oxide semiconductor and may be further preferably 70% or more at atomic ratio in all components in the crystalline oxide semiconductor. For the present inventive subject matter, the content ratio of the metal oxide in the crystalline oxide semiconductor may be most preferably 90% or more at atomic ratio in all components in the crystalline oxide semiconductor. The content ratio of iridium in the metal oxide containing iridium is not particularly limited if an object of the present inventive subject matter is not interfered with. The content ratio of iridium contained in the metal oxide is 0.1% or more at atomic ratio, and may be preferably 1% or more at atomic ratio. According to an embodiment of the present inventive subject matter, the content ratio of iridium in the metal oxide may be further preferably 10% or more at atomic ratio.

A crystal structure of the crystalline oxide semiconductor is not particularly limited if an object of the present inventive subject matter is not interfered with, however, the crystalline oxide semiconductor preferably includes a corundum structure or a β-gallia structure and further preferably includes a corundum structure, to realize more enhanced semiconductor property. The p-type oxide semiconductor containing the crystalline oxide semiconductor as a major component may be a single crystal or may be polycrystalline. Also, the p-type oxide semiconductor is normally in the form of a film, but may be in the form of a plate or in the form of a sheet, as long as an object of the present inventive subject matter is not interfered with.

The p-type oxide semiconductor according to a present inventive subject matter may be preferably obtained by a method described below, and the method of manufacturing a p-type oxide semiconductor is also new and useful and thus, included herein as a present inventive subject matter.

A method of p-type oxide semiconductor according to an embodiment of the present inventive subject matter includes: generating atomized droplets by atomizing a raw material solution containing iridium and optionally containing a metal that is different from iridium (forming atomized droplets), carrying the atomized droplets onto a surface of a base by using a carrier gas (carrying atomized droplets), and causing a thermal reaction of the atomized droplets adjacent to the surface of the base to form a crystal of a metal oxide containing iridium or a mixed crystal of a metal oxide containing iridium (film formation).

(Forming Atomized Droplets)

In forming atomized droplets, a raw material solution including iridium and a metal that is different from iridium and optionally contained is atomized to generate atomized droplets. A raw material solution may be atomized by a known method, and the method is not particularly limited, however, according to an embodiment of the present inventive subject matter, the raw material solution is preferably atomized by use of ultrasonic vibration. Atomized droplets obtained by using ultrasonic vibration have an initial velocity that is zero and floats in the space. Since atomized droplets floating in the space are carriable as a gas, the atomized droplets floating in the space are preferable to avoid damage caused by the collision energy without being blown like a spray. The size of droplets is not limited to a particular size, and may be a few mm, however, the size of the atomized droplets is preferably 50 μm or less. The size of the atomized droplets is preferably in a range of 0.1 μm to 10 μm.

(Raw Material Solution)

If the raw material solution contains iridium and a metal that is different from iridium and optionally contained, the raw material solution is not particularly limited, and thus may contain an inorganic material and/or an organic material. According to an embodiment of the present inventive subject matter, when the raw material solution contains iridium and the metal that is different from iridium, the metal may be a metal of Group 2 of the periodic table, a metal selected from among metals except iridium of Group 9 or a metal of Group 13 of the periodic table. Also, when the raw material solution contains two or more metals including iridium and the metal, a first raw material solution including iridium and a second raw material solution including the metal may be used and separately subjected to the forming atomized droplets process. Each atomized droplets obtained from the first raw material solution and the second raw material solution may be merged at the carrying atomized droplets process or the film formation process. According to an embodiment of the present inventive subject matter, the raw material solution containing iridium and the metal in the form of complex or salt, and dissolved or dispersed in an organic solvent or water may be used. Examples of the form of the complex include acetylacetonate complexes, carbonyl complexes, ammine complexes, hydride complexes. Also, examples of the form of salt include organic metal salts (e.g, metal acetate, metal oxalate, metal citrate, etc), metal sulfide salt, metal nitrate salt, metal phosphate salt, metal halide salt (e.g, metal chloride salt, metal bromide salt, metal iodide salt, etc.). According to a mist CVD method of the present inventive subject matter, the film-formation may be preferably performed even when the raw material concentration is low.

A solvent of the raw material solution is not particularly limited, and thus, the solvent may be an inorganic solvent that includes water. The solvent may be an organic solvent that includes alcohol. The solvent may be a mixed solvent of the inorganic solvent and the organic solvent. According to an embodiment of the present inventive subject matter, unlike the conventional film-forming methods, the solvent may preferably contain water. Also, according to an embodiment of the present inventive subject matter, the solvent may be a mixed solvent of water and acid. Examples of water include pure water, ultrapure water, tap water, well water, mineral water, hot spring water, spring water, fresh water and ocean water. Examples of acid include inorganic acids such as hydrochloric acid, nitric acid, sulfuric acid, or organic acid such as acetic acid, propionic acid, and butanoic acid.

(Base)

The base is not particularly limited if the base is capable of supporting the p-type oxide semiconductor. The material for the base is also not particularly limited if an object of the present inventive subject matter is not interfered with, and the base may be a base of a known material. Also, the base may contain an organic compound and/or inorganic compound. Also, the base may be in any shape and may be valid for all shapes. Examples of the shape of the base include a plate shape, a flat shape, a disc shape, a fibrous shape, a rod shape, a cylindrical shape, a prismatic shape, a tubular shape, a spiral shape, a spherical shape, and a ring shape. According to an embodiment of the present inventive subject matter, a base may be preferably a substrate. Also, according to an embodiment of the present inventive subject matter, the thickness of the substrate is not particularly limited.

According to an embodiment of the present inventive subject matter, the substrate is not particularly limited if the substrate is capable of supporting the p-type oxide semiconductor and if the substrate is a plate shape. The substrate may be an electrically-insulating substrate, a semiconductor substrate or an electrically-conductive substrate, and also a substrate including a metal film on its surface. Examples of the substrate include a base substrate containing a substrate material with a corundum structure as a major component. Examples of the substrate containing a substrate material with a corundum structure as a major component may include, more specifically, a sapphire substrate (preferably a c-plane sapphire substrate), and α-$Ga_2O_3$ substrate. The term "major component" herein means, for example, an atomic ratio of a substrate material with a certain crystal structure in all the elements in a substrate material may be 50% or more. According to an embodiment of the present inventive subject matter, the atomic ratio of the substrate material with a certain crystal structure in all the metal elements in the substrate material may be preferably 70% or more. For the present inventive subject matter, the atomic ratio of the substrate material with a certain crystal structure in all the metal elements in the substrate material may be further preferably 90% or more and may be 100%.

(Carrying Atomized Droplets)

In carrying atomized droplets, the atomized droplets are delivered into the base by carrier gas. The carrier gas is not particularly limited if an object of the present inventive subject matter is not interfered with, and thus, the carrier gas may be oxygen, ozone, an inert gas such as nitrogen and argon. Also, the carrier gas may be a reducing gas such as hydrogen gas and/or forming gas. The carrier gas may contain one or two or more gasses. Also, a diluted carrier gas at a reduced flow rate (e.g., 10-fold diluted carrier gas) and the like may be used further as a second carrier gas. The carrier gas may be supplied from one or more locations. According to an embodiment of the present inventive subject matter, if a mist generator, supply pipe and film-formation chamber are used, the carrier gas supply means may be preferably provided at the mist generator and the supply pipe. In that case, carrier gas supply means may be provided at the mist generator and diluted carrier gas supply means may be provided at the supply pipe. According to an embodiment of the present inventive subject matter, the flow rate of the carrier gas may be preferably in a range of 1 to 10 L/min. When a diluted carrier gas is used, the flow rate of the diluted carrier gas may be in a range of 0.001 to 2 L/min. Furthermore, according to an embodiment of the present inventive subject matter, when diluted carrier gas is used, the flow rate of the dilute carrier gas may be preferably in a range of 0.1 to 1 L/min.

(Film-forming)

In the film-forming, the p-type oxide semiconductor is formed on at least a part of the base by a thermal reaction of the atomized droplets adjacent to the surface of the base. The thermal reaction is not particularly limited if the atomized droplets react on heating, and reaction conditions are not particularly limited if an object of the present inventive subject matter is not impaired. In the film-formation, the thermal reaction if conducted at an evaporation temperature or higher temperature of the evaporation temperature of the solvent of the raw material solution. During the thermal reaction, the temperature should not be too high. For example, the temperature during the thermal reaction may be 1200° C. or less. The temperature during the thermal reaction may be preferably 300° C. to 700° C. or 750° C. to 1200° C. According to an embodiment of the present inventive subject matter, the temperature during the thermal reaction may be further preferably 350° C. to 600° C. or 750° C. to 1100° C. The thermal reaction may be conducted in any atmosphere of a vacuum, a non-oxygen atmosphere, a reducing gas atmosphere, and an oxidizing atmosphere. Also, the thermal reaction may be conducted in any conditions of under an atmospheric pressure, under an increased pressure, and under a reduced pressure. According to an embodiment of the present inventive subject matter, the thermal reaction is preferably conducted in oxidizing atmosphere. Also, according to an embodiment of the present inventive subject matter, the thermal reaction is preferably conducted under an atmospheric pressure. The thermal reaction is further preferably conducted in oxidizing atmosphere and under an atmospheric pressure. "Oxidizing atmosphere" is not particularly limited if being an atmosphere in which a crystal or a mixed crystal of the metal oxide including iridium can be formed by the thermal reaction. The oxidizing atmosphere may be obtained, for example, by using a carrier gas including oxygen, or by using an atomized droplets of raw material solution including an oxidant. The film thickness of the p-type oxide semiconductor is able to be set by adjusting a film formation time. The film thickness of the p-type oxide semiconductor may be 1 nm to 1 mm. According to an embodiment of the present inventive subject matter, the film thickness of the p-type oxide semiconductor may be preferably 1 nm to 100 μm, for a reason that the semiconductor characteristics would be further improved. The film thickness of the p-type oxide semiconductor may be further preferably 1 nm to 10 μm.

According to an embodiment of the present inventive subject matter, the p-type oxide semiconductor may be provided directly on the base or may be provided via another layer such as a semiconductor layer (n-type semiconductor layer, n$^+$-type semiconductor layer, n$^-$-type semiconductor layer, for example) that is different from a semiconductor of the p-type oxide semiconductor, an insulating layer including a semi-insulating layer, or a buffer layer on the base. Examples of the semiconductor layer and the insulating layer include a semiconductor layer including the metal of Group 13 of the periodic table and an insulating layer including the metal of Group 13 of the periodic table. Preferable examples of the buffer layer may include a semiconductor layer with a corundum structure, an insulating layer with a corundum structures, and a conductive layer with a corundum structure. Examples of the semiconductor layer include $\alpha$-Fe$_2$O$_3$, $\alpha$-Ga$_2$O$_3$, or $\alpha$-Al$_2$O$_3$. A method of forming the buffer layer on the base is not particularly limited and may be by use of a method similarly to a method of forming the p-type oxide semiconductor as mentioned above.

According to an embodiment of the present inventive subject matter, the n-type oxide semiconductor layer is preferably formed before or after the formation of the p-type oxide semiconductor layer. More specifically, the above-mentioned method of manufacturing the semiconductor device may preferably include at least forming a p-type oxide semiconductor and also forming an n-type oxide semiconductor layer. The method of forming the n-type semiconductor layer is not particularly limited and may be a known method, however, according to an embodiment of the present inventive subject matter, the n-type semiconductor layer may be preferably formed by mist CVD method. The n-type semiconductor layer preferably contains an oxide semiconductor as a major component. The oxide semiconductor contained in the n-type semiconductor layer may preferably contain a metal of Group 2 (Be, Mg, Ca, Sr, Ba, for example), a metal of Group 9 (Co, Rh, Ir, for example) or a metal of Group 13 (Al, Ga, In, Tl, for example). According to an embodiment of the present inventive subject matter, the n-type semiconductor layer may preferably contain a crystalline oxide semiconductor as a major component, may further preferably contain as a major component a crystalline oxide semiconductor containing Ga, and may most preferably contain as a major component a crystalline oxide semiconductor with a corundum structure containing Ga and a corundum structure. Also, according to an embodiment of the present inventive subject matter, a difference in lattice constants between the oxide semiconductor contained as a major component in the n-type semiconductor layer and the p-type oxide semiconductor may be preferably 1.0% or less, to realize an enhanced p-n junction, and the difference in lattice constants may be further preferably 0.3% or less. The term "difference in lattice constant" herein is defined as a numerical value (%) obtained by subtracting a lattice constant of the p-type oxide semiconductor from a lattice constant of the oxide semiconductor contained as a major component in the n-type semiconductor layer to obtain a value of difference, next, dividing the value of difference by the lattice constant of the p-type oxide semiconductor to obtain an absolute value, and then, multiplying the absolute value by 100. As an example, in that the difference in lattice constants of a p-type oxide semiconductor layer and an n-type oxide semiconductor layer is 1.0% or less, the p-type oxide semiconductor has a corundum structure and the oxide semiconductor as the major component of the n-type semiconductor also has a corundum structure. Furthermore, the p-type oxide semiconductor is preferably a single crystal of Ir$_2$O$_3$ or a mixed crystal of Ir$_2$O$_3$ and the oxide semiconductor contained as the major component in the n-type semiconductor layer is preferably a single crystal of Ga$_2$O$_3$ or a mixed crystal Ga$_2$O$_3$ according to embodiments of a present inventive subject matter.

The p-type oxide semiconductor obtained by above-mentioned method is able to be used for a semiconductor device as a p-type semiconductor layer. The p-type oxide semiconductor is particularly useful for a power device. Semiconductor devices may be categorized into lateral devices and vertical devices. In a lateral device, a first electrode and a second electrode may be formed on one side of a semiconductor layer. In a vertical devices, a first electrode may be formed on a first side of a semiconductor layer and a second electrode may be formed on a second side of the semiconductor layer. The first side is positioned opposite to the second side of the semiconductor layer. According to an embodiment of a present inventive subject matter, the p-type oxide semiconductor may be used for the lateral devices and also used for vertical devices. According to an embodiment of the present inventive subject matter, the p-type oxide semiconductor may be preferably used for vertical devices. Examples of the semiconductor device include Schottky barrier diode (SBDs), metal semiconductor field-effect transistors (MESFETs), high-electron-mobility transistors (HEMTs), metal oxide semiconductor field-effect transistors (MOSFETs), static induction transistors (SIT), junction field-effect transistors (JFETs), insulated gate bipolar transistors (IGBTs), and light emitting diodes.

FIG. 3 to FIG. 9 show examples of using the p-type oxide semiconductor of the present inventive subject matter as a p-type semiconductor layer. According to an embodiment of the present inventive subject matter, an n-type semiconductor may be a semiconductor containing the same major component as the major component of the p-type semiconductor layer and an n-type dopant. The n-type semiconductor may be a semiconductor containing a different major component that is different from the major component of the p-type oxide semiconductor. Also, the n-type semiconductor may be used as an n$^-$-type semiconductor layer or an n$^+$-type semiconductor layer by using known method such as adjusting a concentration of n-type dopant in the n-type oxide semiconductor.

Figure 3:
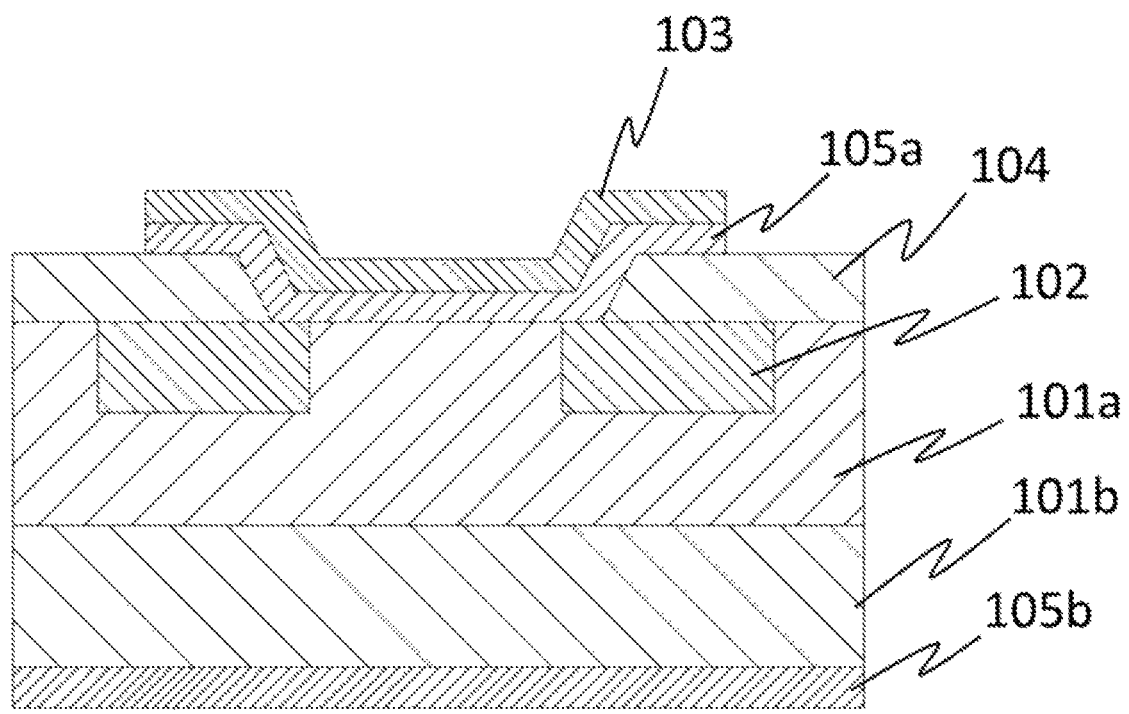
FIG. 3 shows a schematic view of an embodiment of a Schottky barrier diode (SBD) according to the present inventive subject matter.
Figure 4:
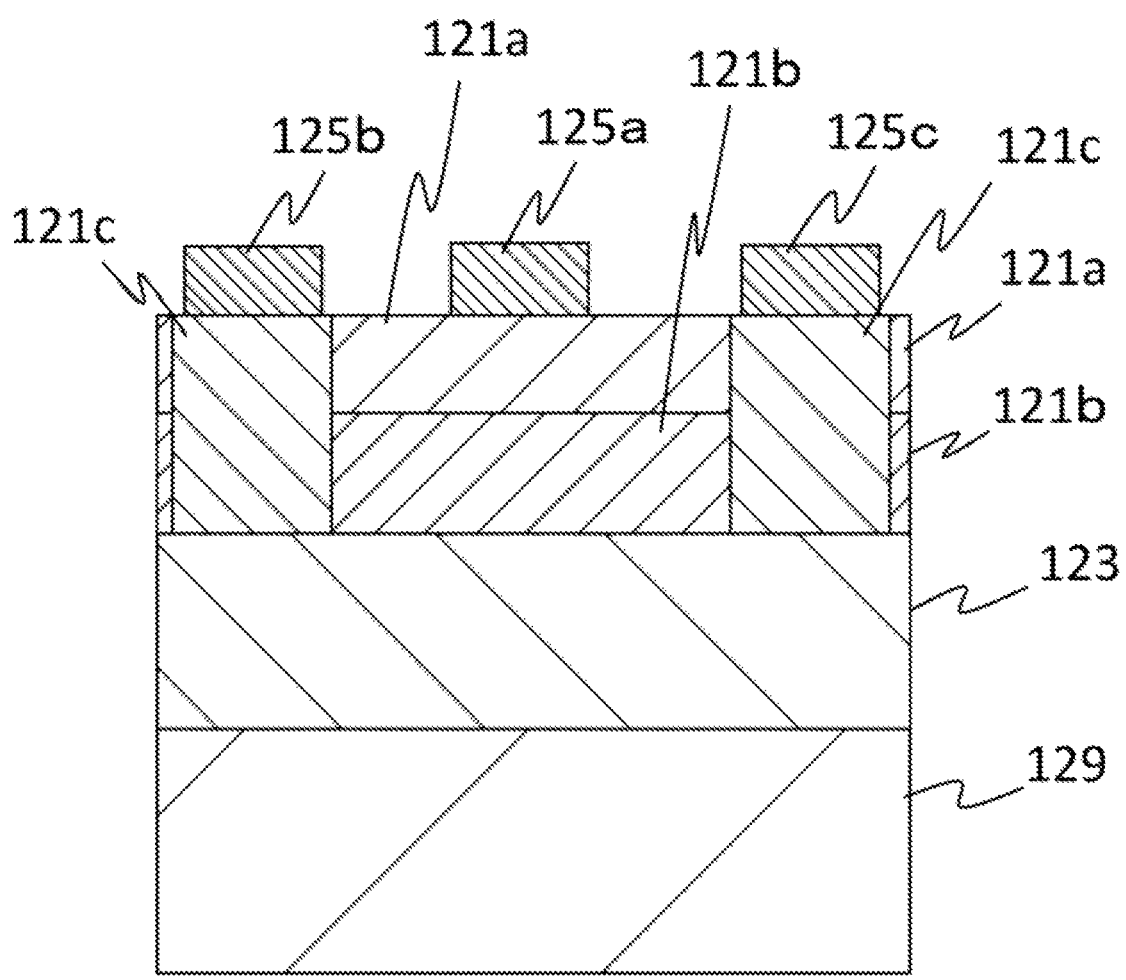
FIG. 4 shows a schematic view of an embodiment of a high electron mobility transistor (HEMT) according to the present inventive subject matter.

FIG. 3 shows a schematic view of an embodiment of a Schottky barrier diode (SBD) according to the present inventive subject matter including an n$^-$-type semiconductor layer 101a, an n$^+$-type semiconductor layer 101b, a p-type semiconductor layer, a metal layer 103, an insulating layer 104, a Schottky electrode 105a and an Ohmic electrode 105b. The metal layer 103 is comprised of a metal such as aluminum and covers the Schottky electrode 105a. FIG. 4 shows a schematic view of an embodiment of high-electron-mobility transistor (HEMT) according to the present inventive subject matter including an n-type semiconductor layer with wide band gap 121a, an n-type semiconductor layer with narrow band gap 121b, n$^+$-type semiconductor layer 121c, a p-type semiconductor layer 123, a gate electrode 125a, a source electrode 125b, a drain electrode 125c, and a substrate 129.

The material of the Schottky electrode and the Ohmic electrode may be a known electrode material. Examples of such an electrode material include metals, containing Al, Mo, Co, Zr, Sn, Nb, Fe, Cr, Ta, Ti, Au, Pt, V, Mn, Ni, Cu, Hf, W, Ir, Zn, In, Pd, Nd, Ag and/or alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials.

Also, the Schottky electrode and the Ohmic electrode may be formed by a known method such as vacuum evaporation or sputtering. For more details, when forming the Schottky electrode, a first layer containing Mo is formed and a second layer containing Al is formed on the first layer. Then photolithography, for example, can form a pattern at the first layer and at the second layer.

Examples of the material for the insulating layer include GaO, AlGaO, InAlGaO, AlInZnGaO4, AlN, Hf$_2$O$_3$, SiN, SiON, Al$_2$O$_3$, MgO, GdO, SiO$_2$, and/or Si$_3$N$_4$. According to an embodiment of the present inventive subject matter, the insulating layer may preferably contains a corundum structure. The insulating layer may be formed by a known method such as sputtering, vacuum evaporation or CVD method.

Figure 5:
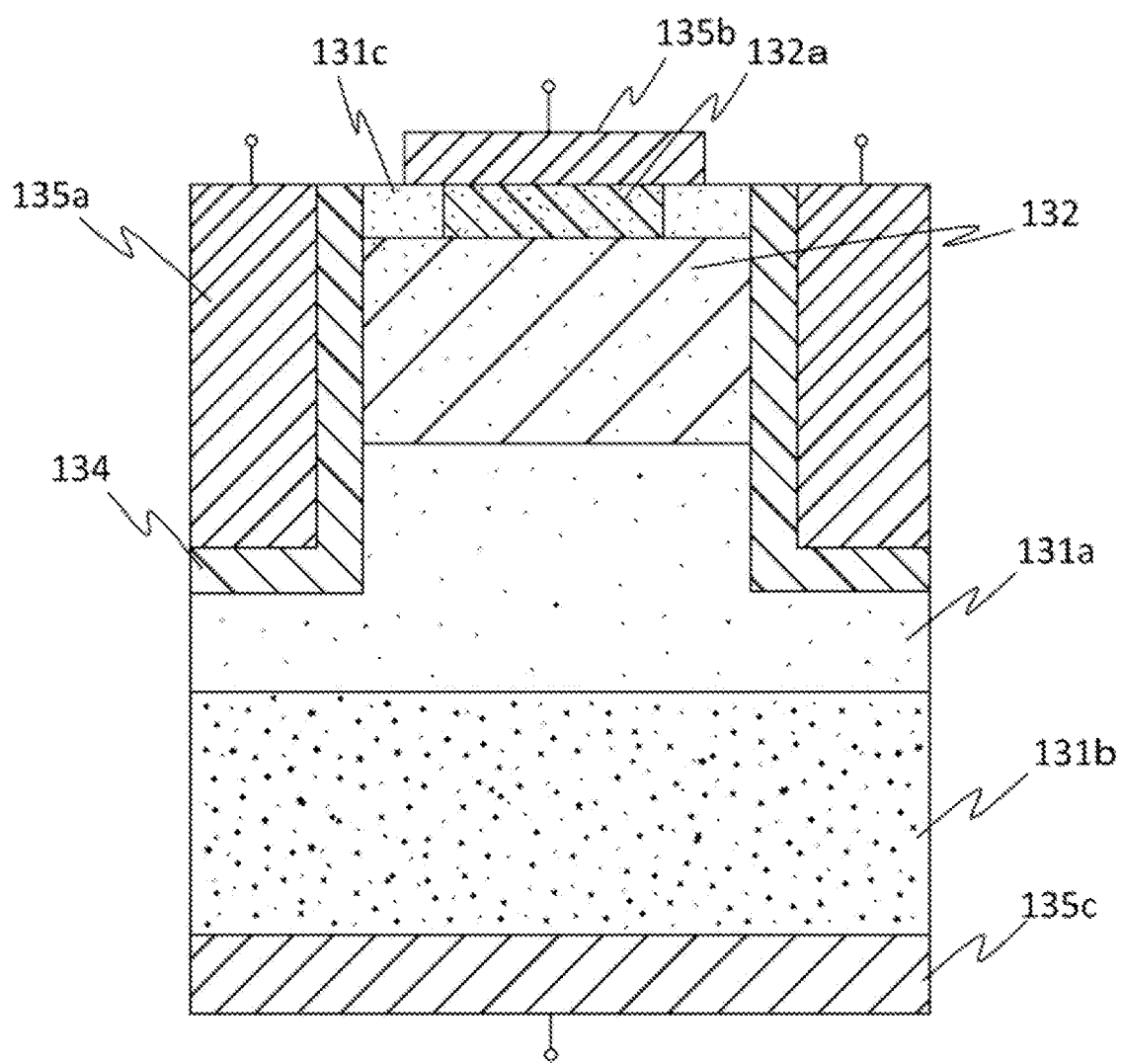
FIG. 5 shows a schematic view of an embodiment of a metal oxide semiconductor field effect transistor (MOSFET) according to the present inventive subject matter.
Figure 6:
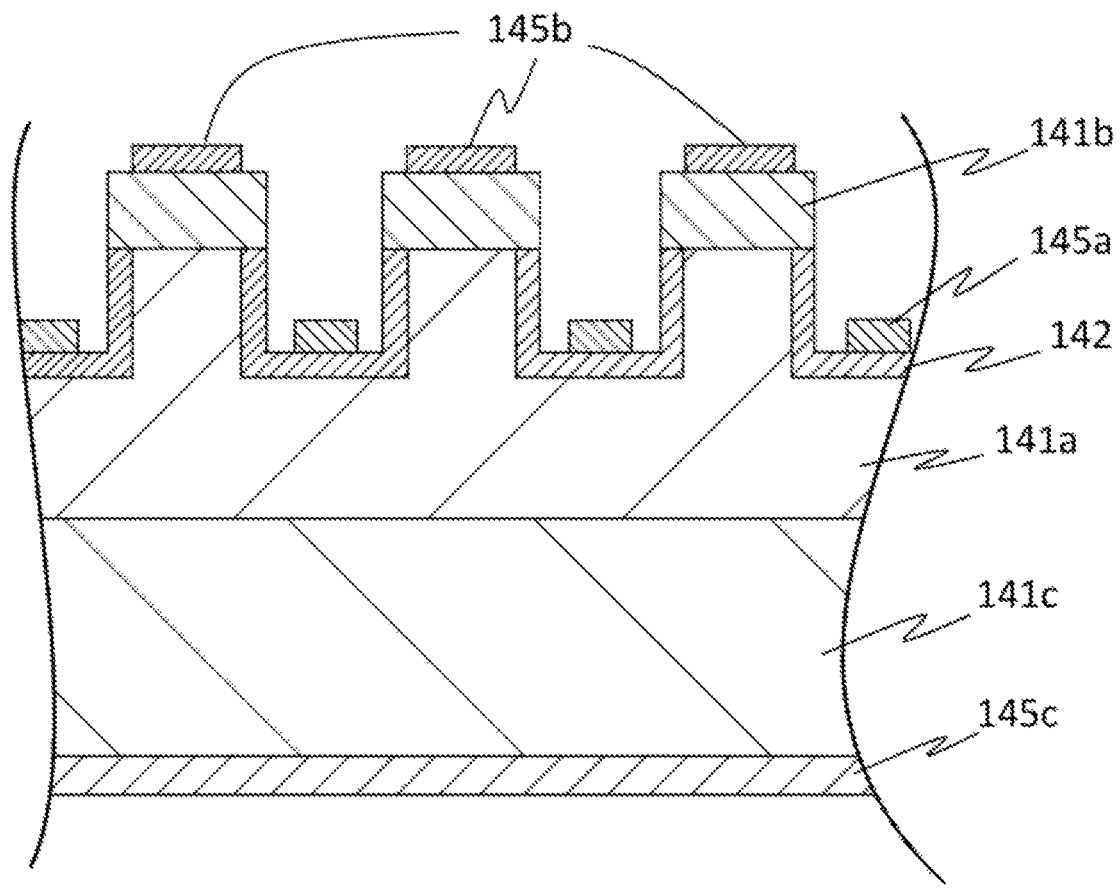
FIG. 6 shows a schematic view of an embodiment of junction field effect transistor (JFET) according to the present inventive subject matter.
Figure 7:
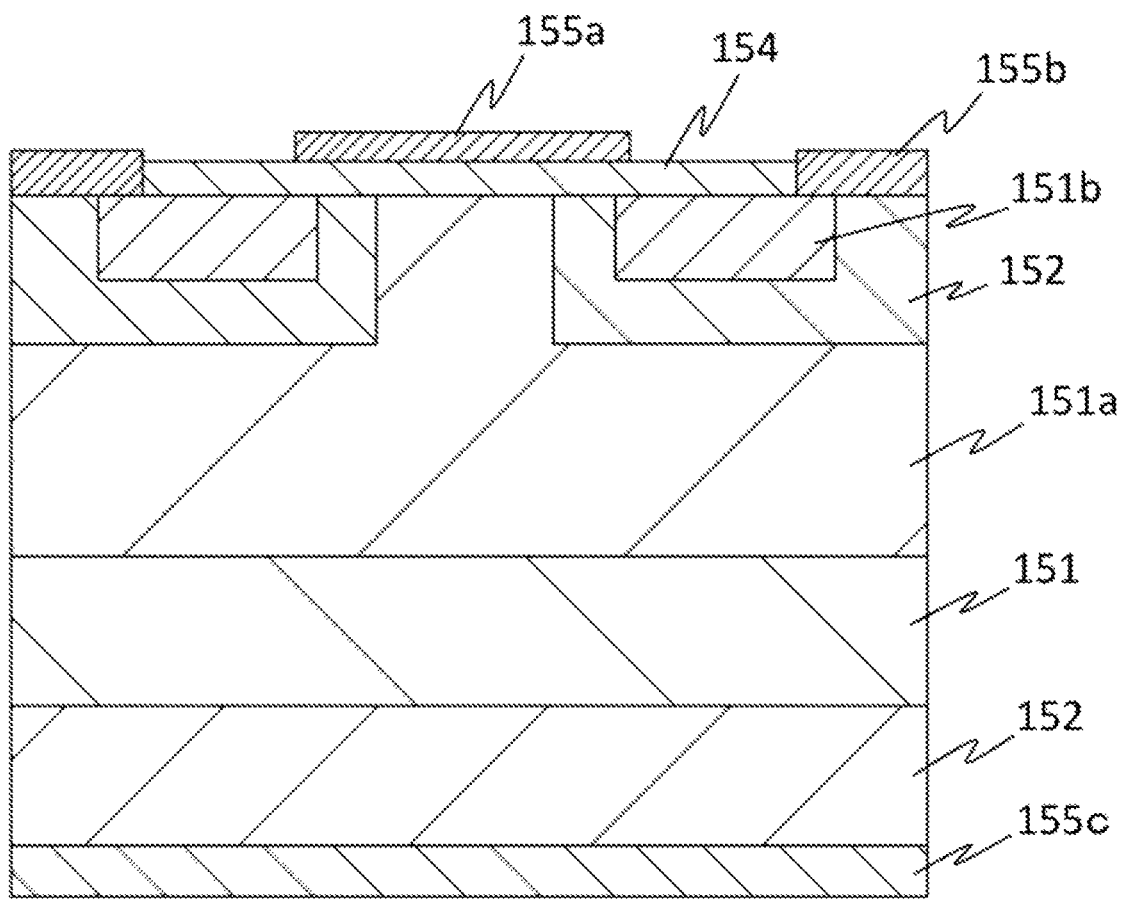
FIG. 7 shows a schematic view of an embodiment of insulated gate bipolar transistor (IGBT) according to the present inventive subject matter.

FIG. 5 shows a schematic view of an embodiment of a metal oxide semiconductor field-effect transistors (MOSFET) according to the present inventive subject matter. The MOSFET includes an n-type semiconductor layer 131a, a first n$^+$-type semiconductor layer 131b, a second n$^+$-type semiconductor layer 131c, a p-type semiconductor layer 132, a p$^+$-type semiconductor layer 132a, a gate insulating layer 134, a gate electrode 135, a source electrode 135b and a drain electrode 135c. FIG. 6 shows a schematic view of an embodiment of a junction field-effect transistors (JFET) according to the present inventive subject matter including an n$^-$-type semiconductor layer 141a, a first n$^+$-type semiconductor layer 141b, a second n$^+$-type semiconductor layer 141c, a p-type semiconductor layer 142, a gate electrode 145a, a source electrode 145b and a drain electrode 145c. FIG. 7 shows a schematic view of an embodiment of an insulated gate bipolar transistor (IGBT) according to the present inventive subject matter including an n-type semiconductor layer 151, an n-type semiconductor layer 151a, n$^+$-type semiconductor layer 151b, a p-type semiconductor layer 152, a gate insulating layer 154, a gate electrode 155a, an emitter electrode 155b and a collector electrode 155c.

Figure 8:
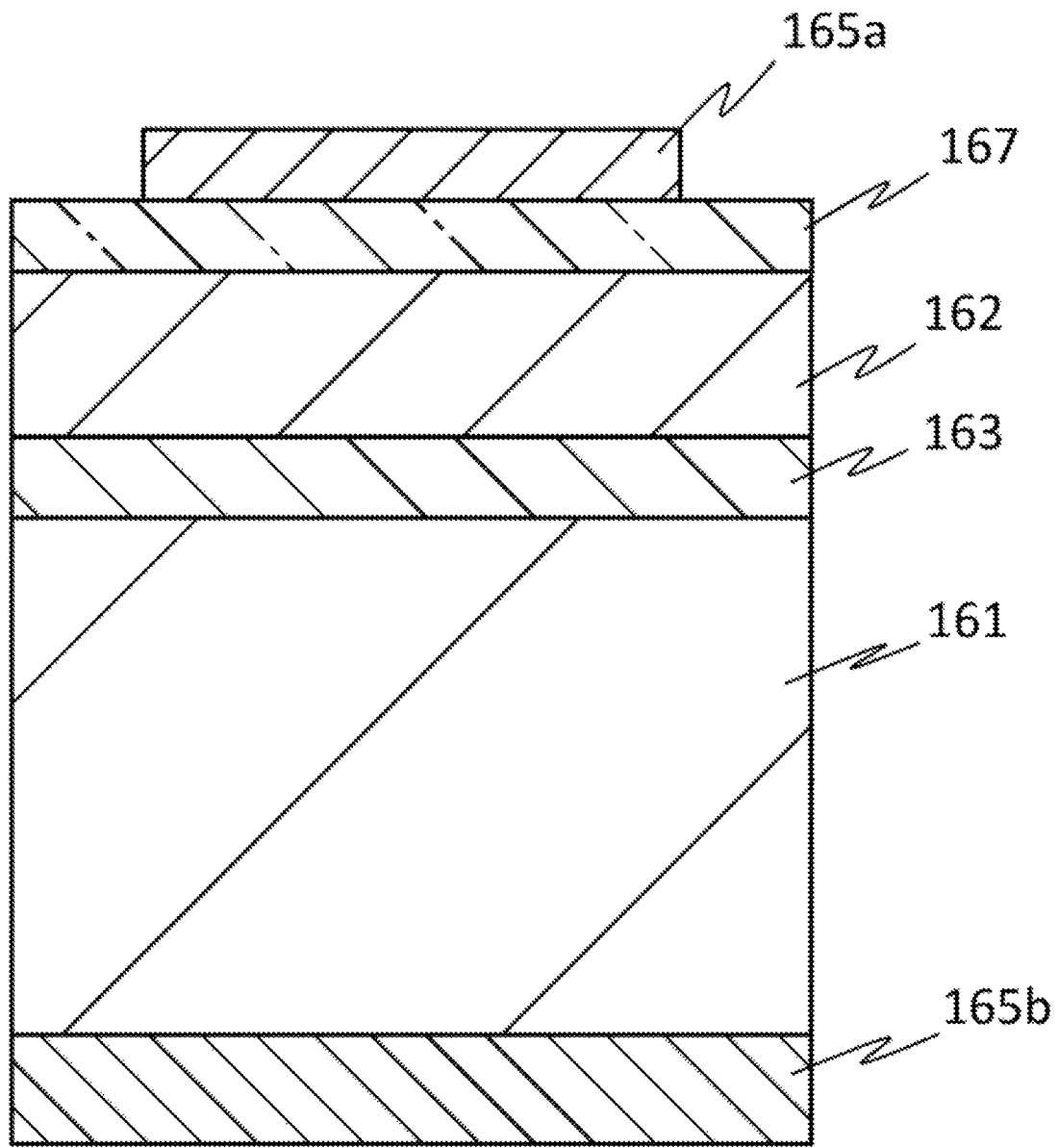
FIG. 8 shows a schematic view of an embodiment of light emitting diode (LED) according to the present inventive subject matter.

FIG. 8 shows a schematic view of an embodiment of a light emitting diode (LED) according to the present inventive subject matter. The LED shown in FIG. 8 includes an n-type semiconductor layer 161 on a second electrode 165b, and a light emitting layer 163 is positioned on the n-type semiconductor layer 161. Also, a p-type semiconductor layer 162 is positioned on the light emitting layer 163. A light-transmitting electrode 167, that permeates the light generated in the light emitting layer 163, is provided on the p-type semiconductor layer 162. A first electrode is positioned on the light-transmitting electrode 167. A light emitting material used for the light emitting layer may be a known material. The light emitting device shown in FIG. 8 may be covered with a protective layer except for the electrode portion.

Examples of the material of the light-transmitting electrode include oxide conductive material containing indium or titanium. Regarding the material of the light-transmitting electrode, in detail, the material may be In$_2$O$_3$, ZnO, SnO$_2$, Ga$_2$O$_3$, TiO$_2$, a mixed crystal thereof. The material may contain a dopant. By providing those materials using known method such as sputtering, the light-transmitting electrode would be formed. Also, annealing may be carried out after forming the light-transmitting electrode, in order to make the electrode more transparent.

According to the light emitting diode of FIG. 8, the light-emitting layer 163 is configured to emit light by applying a current to the p-type semiconductor layer 162, the light emitting layer 163, and the n-type semiconductor layer, through the first electrode 165a as a positive electrode and the second electrode as a negative electrode.

Examples of the material of the first electrode 165a and the second electrode 165b include Al, Mo, Co, Zr, Sn, Nb, Fe, Cr, Ta, Ti, Au, Pt, V, Mn, Ni, Cu, Hf, W, Ir, Zn, Pd, Nd, Ag and/or alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. A forming method of the first and the second electrode is not particularly limited. Examples of the forming method of the first and the second electrode include wet methods such as printing method, spray method, coating method, physical methods such as vacuum deposition method, sputtering method, ion planting method, chemical methods such as CVD method, plasma CVD method. The forming method may be selected from above mentioned methods in consideration of a suitability for the material of the first electrode and the second electrode.

Figure 9:
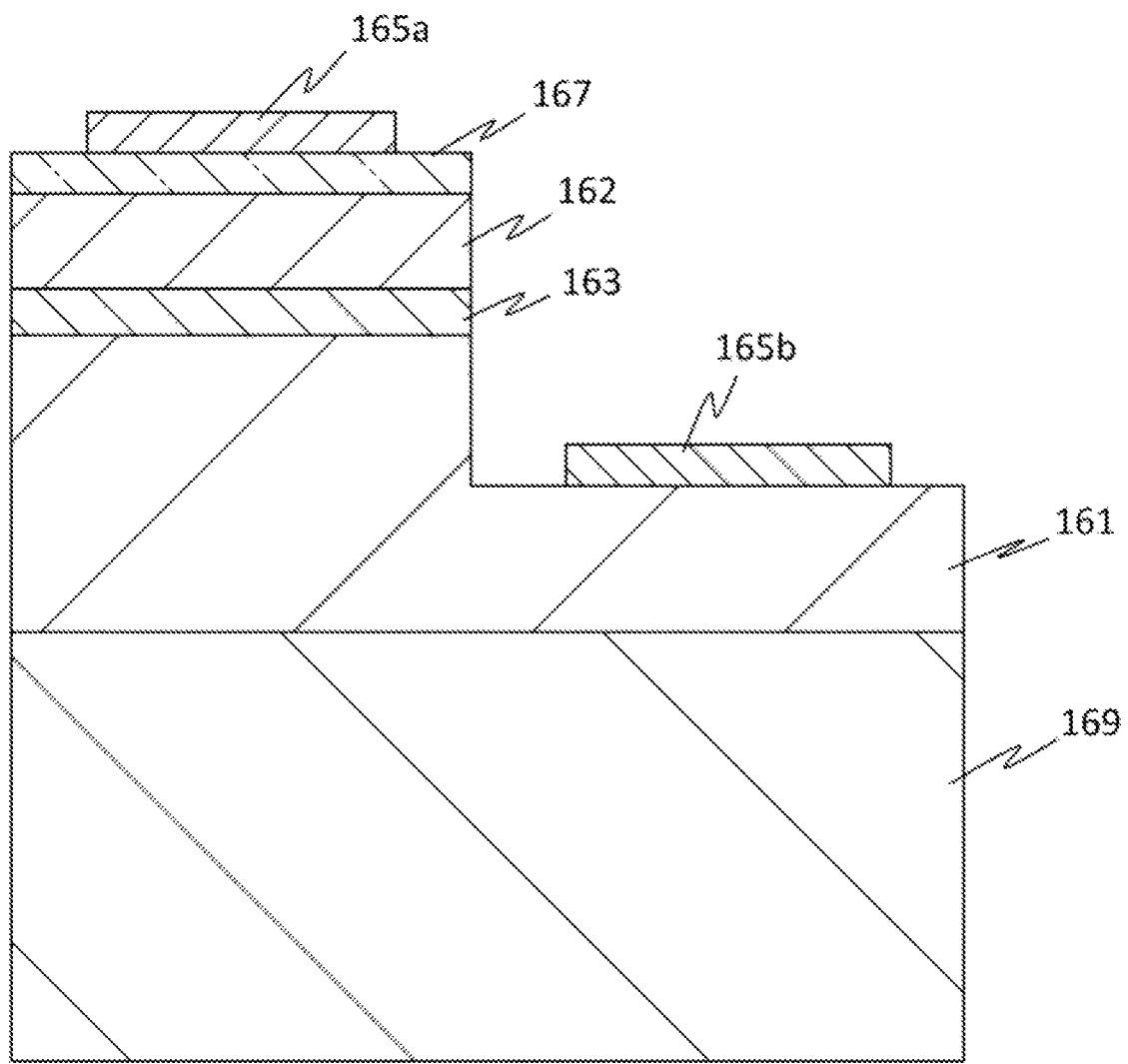
FIG. 9 shows a schematic view of an embodiment of light emitting diode (LED) according to the present inventive subject matter.

FIG. 9 shows a schematic view of another embodiment of a light emitting diode (LED) according to the present inventive subject matter. In the LED of FIG. 9, an n-type semiconductor layer 161 is arranged on the substrate 169, and the second electrode 165b is arranged on a part of the exposed surface of the n-type semiconductor layer 161, in which the exposed surface is formed by cutting out a part of a p-type semiconductor layer 162, light-emitting layer 163 and the n-type semiconductor layer 161.

Figure 13:
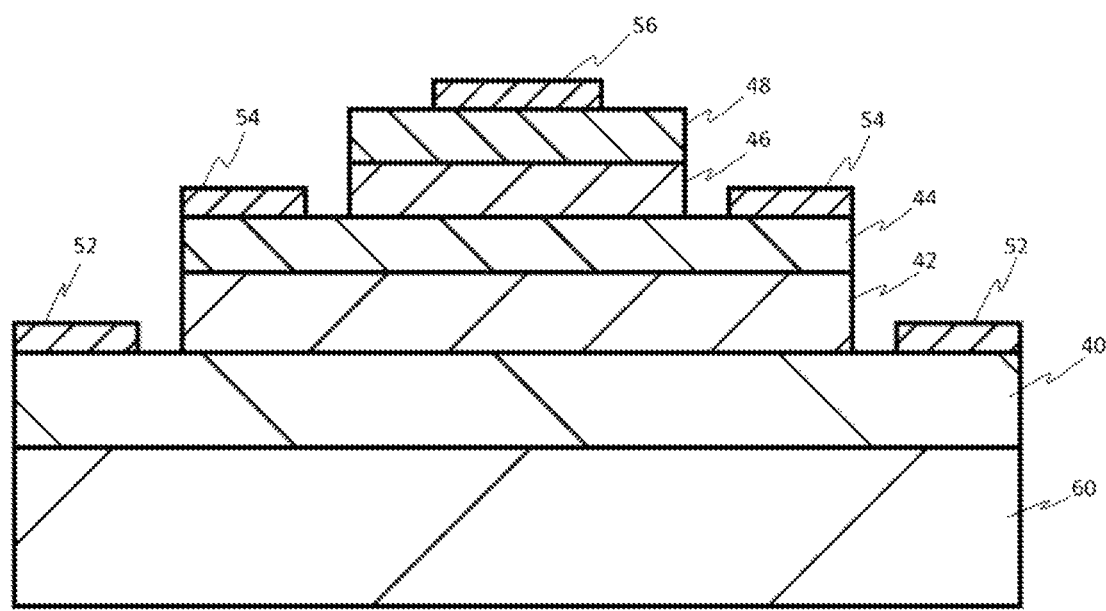
FIG. 13 shows a schematic view of an embodiment of heterojunction bipolar transistor (HBT) according to the present inventive subject matter.

FIG. 13 shows a schematic view of an embodiment of a heterojunction bipolar transistor (HBT) according to the present inventive subject matter. The HBT of FIG. 13 is able to have either an npn structure or a pnp structure. Hereinafter, an embodiment with the npn structure according to the present inventive subject matter will be described in detail, however, an embodiment with the pnp structure is the same as the embodiment with the npn structure in the point that the p-type layer with the of npn structure is replaceable by an n-type layer, and the n-type layer of the npn structure is replaceable by the p-type layer. The substrate 60 may be a semi-insulating base and may have a high resistivity (for example, more than $10^5$ Ωcm). The substrate 60 may have an n-type conductivity.

A collector layer 42 is formed above the substrate 60. The collector layer 42 may have a thickness of, for example, 200 nm to 100 μm and may preferably have a thickness of 400 nm to 20 μm. The collector layer 42 may contain as a major component a corundum-structured n-type oxide semiconductor. According to an embodiment of the present inventive subject matter, the n-type oxide semiconductor contained in the collector layer 42 may preferably contain as a major component an oxide semiconductor containing a metal of Group 2 of the periodic table (Be, Mg, Ca, Sr, Ba, for example), a metal of Group 9 of the periodic table (Co, Rh, Ir, for example), or a metal of Group 13 of the periodic table (Al, Ga, In, Tl, for example). According to an embodiment of the present inventive subject matter, the n-type oxide semiconductor contained in the collector layer may further preferably contain at least one metal selected from among aluminum, indium and gallium. For the present inventive subject matter, the n-type oxide semiconductor contained in the collector layer may be most preferably a gallium oxide or a mixed crystal of gallium oxide. The term "major component" herein means the same as the meaning of "major component" as mentioned above. Also, according to an embodiment of the present inventive subject matter, a dopant contained in the n-type oxide semiconductor (Sn, Ge, Si, or Ti, for example) normally has a concentration that is approximately $1\times10^{16}/cm^3$ to $1\times10^{22}/cm^3$. According to an embodiment of the present inventive subject matter, the n-type oxide semiconductor may be an $n^-$-type semiconductor by adjusting the concentration of the n-type dopant in the n-type oxide semiconductor to be approximately $1\times10^{17}/cm^3$ or less. Also, the n-type oxide semiconductor may be an $n^+$-type semiconductor by adjusting the concentration of the n-type dopant in the n-type oxide semiconductor to be approximately $1\times10^{20}/cm^3$ or more.

According to an embodiment of the present inventive subject matter, especially when the substrate 60 is semi-insulating, a sub-collector layer 40 may be provided between the collector layer 42 and the substrate 60. The sub-collector layer 40 may preferably contain as a major component a corundum-structured $n^+$-type oxide semiconductor. According to an embodiment of the present inventive subject matter, the $n^+$-type oxide semiconductor contained in the sub-collector layer 40 may preferably contain as a major component an oxide semiconductor containing a metal of Group 2 of the periodic table (Be, Mg, Ca, Sr, Ba, for example), a metal of Group 9 of the periodic table (Co, Rh, Ir, for example), or a metal of Group 13 of the periodic table (Al, Ga, In, Tl, for example). According to an embodiment of the present inventive subject matter, the $n^+$-type oxide semiconductor contained in the sub-collector layer 40 may further preferably contains at least one metal selected from among aluminum, indium and gallium. For the present inventive subject matter, the $n^+$-type oxide semiconductor contained in the sub-collector layer 40 may be most preferably a gallium oxide or a mixed crystal of gallium oxide. The term "major component" herein means as same as the above mentioned "major component".

The thickness of the sub-collector layer 40 may be approximately 0.1 to 100 μm. A collector electrode 52 is formed on a surface of the sub-collector layer 40. The sub-collector layer 40 aims to enhance the performance of the ohmic collector electrode 52. The sub-collector layer 40 may be omitted if the substrate 60 is electrically conductive.

A base layer 44 is formed on the collector layer 42. Normally, the base layer 44 is not particularly limited as long as the base layer 44 contains as a major component the p-type oxide semiconductor according to an embodiment of the present inventive subject matter. The thickness of the base layer 44 is not particularly limited and may be preferably 10 nm to 10 μm, and may be further preferably 10 nm to 1 μm. According to an embodiment of the present inventive subject matter, it is preferable that the composition of the base layer 44 is gradually changed from a portion in contact with the collector layer to a portion adjacent to the top of the base layer 44. According to another preferably embodiment of the present inventive subject matter, a super lattice may be arranged to be deposited on the base layer 44.

A emitter layer 46 is formed on the base layer 44. The emitter layer 46 may preferably contain as a major component a corundum-structured n-type oxide semiconductor. According to an embodiment of the present inventive subject matter, the n-type oxide semiconductor contained in the emitter layer 46 may preferably contain as a major component an oxide semiconductor containing a metal of Group 2 of the periodic table (Be, Mg, Ca, Sr, Ba, for example), a metal of Group 9 of the periodic table (Co, Rh, Ir, for example), or a metal of Group 13 of the periodic table (Al, Ga, In, Tl, for example). According to an embodiment of the present inventive subject matter, the n-type oxide semiconductor contained in the emitter layer may further preferably contain at least one metal selected from among aluminum, indium and gallium. For the present inventive subject matter, the n-type oxide semiconductor contained in the emitter layer 46 may be most preferably a gallium oxide or a mixed crystal of gallium oxide. The term "major component" herein means the same as the meaning of "major component" as mentioned above. The thickness of the emitter layer is not particularly limited and may be 10 nm to 100 μm. The emitter layer 46 normally has a wider band gap than the base layer 44. According to a preferable embodiment of the present inventive subject matter, the composition of the emitter layer 46 may be gradually changed from the interface with the base layer 44 to the top of the emitter layer 46.

According to an embodiment of the present inventive subject matter, a cap layer 48 may be preferably formed on the emitter layer 46. The cap layer 48 may be a layer of $n^+$-type oxide semiconductor and may be preferably a layer of $n^+$-type oxide semiconductor containing at least one metal selected from among aluminum, indium and gallium. According to an embodiment of the present inventive subject matter, the cap layer 48 may be further preferably a layer of $n^+$-doped gallium oxide or a layer of a mixed crystal of $n^+$-doped gallium oxide. The thickness of the cap layer 48 is not particularly limited and may be 10 nm to 100 μm. The base layer 44 can be exposed, for example, by etching the cap layer 48 emitter layer 46. Also, when an upward collector electrode is provided, for example, it is possible to expose the sub-collector layer 40 by etching further layers to make a deeper through-hole.

Each of the collector electrode 52, a base electrode 54 and an emitter electrode 56 may be preferably an ohmic metal electrode. The emitter electrode 56 is formed on the cap layer 48 to be deposited. The base electrode 54 is formed, for example, on an exposed surface of the base layer 44 exposed by etching. The collector electrode 52 is formed on the sub-collector layer 40 as mentioned above. According to another embodiment of the present inventive subject matter, when the substrate is an n-type semiconductor, the collector electrode (not shown in FIG. 13) is provided on a back side that is an opposite side of the side with the device structure of the substrate.

The material of each electrode is not particularly limited and a known material may be used for each electrode. According to an embodiment of the present inventive subject matter, examples of suitable components for each electrode include a known material for an ohmic electrode (that is Ni, Al, Ti, Pt, Au and laminate thereof, for example). The thickness of each electrode is not particularly limited and may be approximately 10 to 100 μm. The deposition of each electrode may be conducted by electron beam evaporation, thermal evaporation, sputtering or deposition methods. According to an embodiment of the present inventive subject matter, annealing may be conducted after the deposition of each electrode, in order to achieve an ohmic contact. The temperature of annealing is not particularly limited and may be approximately 300° C. to 1000° C.

It should be noted that an HBT with the pnp structure is obtained, by replacing the p-type layer of the HBT with the pnp structure by the n-type layer of the HBT with the npn structure, and also obtainable by replacing the n-type layer of the HBT with the pnp structure by the p-type layer of the HBT with the npn structure.

Figure 10:
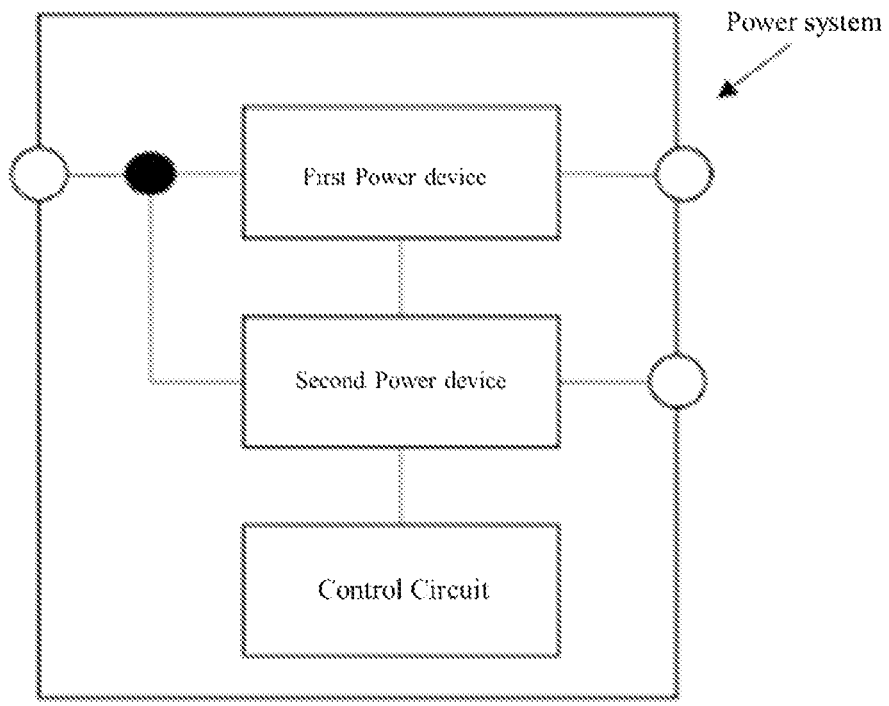
FIG. 10 shows a schematic view of a power system according to an embodiment of the present inventive subject matter.
Figure 11:
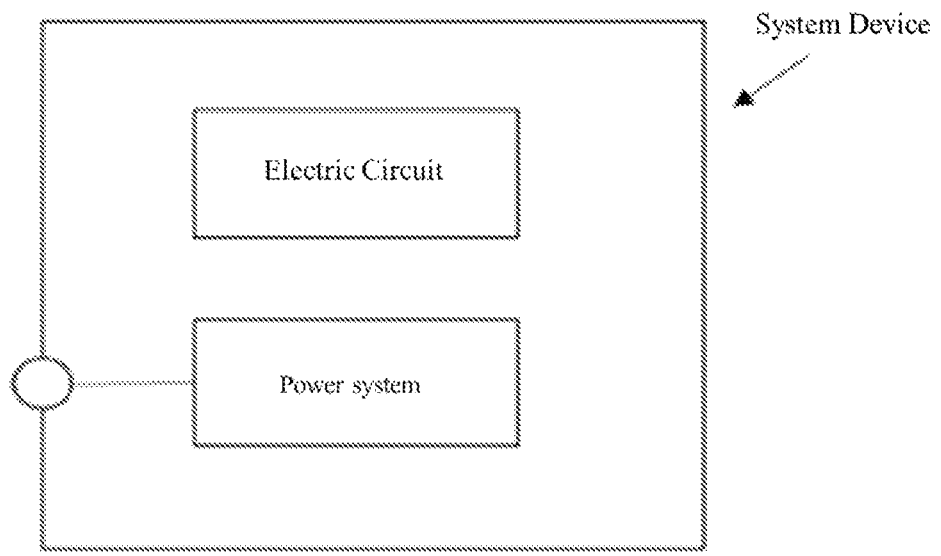
FIG. 11 shows a schematic view of a system device according to an embodiment of the present inventive subject matter.
Figure 12:
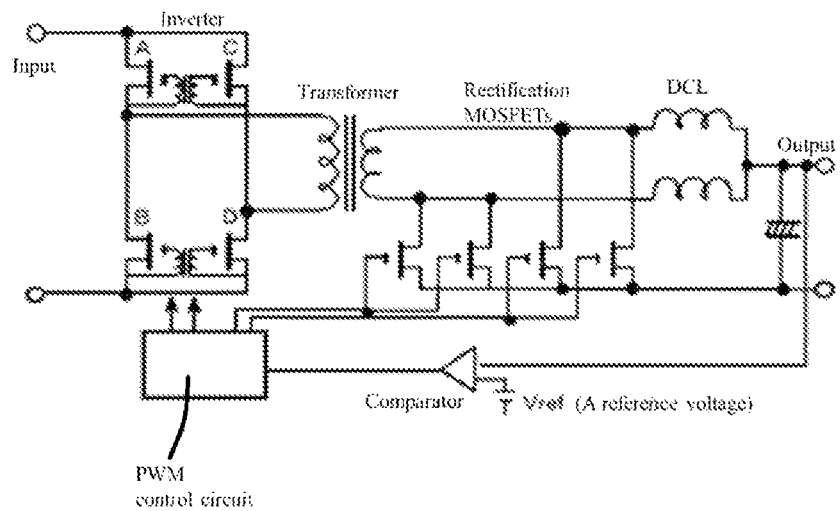
FIG. 12 shows a schematic view of a circuit diagram of power supply circuit of a power device according to an embodiment of the present inventive subject matter.

In addition, according to an embodiment of the present inventive subject matter, the semiconductor device may be used in a semiconductor system including a power source. The power source may be obtained by electrically connecting the semiconductor device to a wiring pattern using a known method. FIG. 10 shows a schematic view of a power system according to an embodiment of the present inventive subject matter. The semiconductor system of FIG. 10 includes two or more power devices (power sources) and a control circuit. The power system may be used for a system device in combination with an electric circuit, as shown in FIG. 11. FIG. 12 shows a schematic view of a circuit diagram of a power supply circuit of a power device including a power circuit and a control circuit. A DC voltage is switched at high frequencies by an inverter (configured with MOSFET A to D) to be converted to AC, followed by an insulation and transformation by a transformer. The voltage is the rectified by rectification MOSFETs and the smoothed by a DCL (smoothing coils L1 and L2) and a capacitor to output a direct current voltage. At this point, the output voltage is compared with a reference voltage by a voltage comparator to control the inverter and the rectification MOSFETs by a PWM control circuit to have a desired output voltage.

EXAMPLE

Example I

1. Film Formation Apparatus

Regarding a film-formation apparatus, a mist CVD apparatus 19 used in an embodiment of a method according to the present inventive subject matter is described below with FIG. 1. The mist CVD apparatus 19 includes a susceptor 21 on which a substrate 20 is placed. The mist CVD apparatus 19 includes a carrier gas supply device 22a, a first flow-control valve 23a that is configured to control a flow of carrier gas sent from the carrier gas supply device 22a, a diluted gas supply device 22b, a second flow-control valve 23b to control a flow of a carrier gas that is configured to be sent from the diluted carrier gas supply device 22b, a mist generator 24 in that a raw material solution 24a is contained, a container 25 in that water 25a is contained, an ultrasonic transducer 26 attached to a bottom of the vessel 25, a supply pipe 27 that may be a quartz pipe with an inside diameter that may be 40 mm, and a heater 28 arranged at a peripheral portion of the supply pipe 27. The susceptor 21 includes a surface that is slanted off the horizontal and on that the substrate 20 is arranged. The susceptor 21 is made of quartz. Since the susceptor 21 and the supply pipe 27 that are configured to be a film-formation chamber are made of quartz, this configuration reduces a possibility that a foreign substance entering a film that is formed on the substrate 20.

2. Preparation of a Raw-Material Solution

An aqueous solution is prepared as a raw material solution by adding magnesium aceetylacetonate and hydrochloric acid into iridium acetylacetonate with iridium that is 0.005 mol/L such that magnesium acetylacetonate is to be 1% in a molar ratio and hydrochloric acid is to have the same number of moles.

3. Film Formation Preparation

The raw material solution 24a obtained at 2. Preparation of the Raw-Material Solution above was set in the mist generator 24. Then, as a substrate 20, a c-plane sapphire substrate was placed on the susceptor 21, and the heater 28 was activated to raise the temperature of the heater 28 up to 500° C. The first flow-control valve 23a and the second flow-control valve 23b were opened to supply carrier gas from the gas supply device 22a and the diluted carrier gas supply device 22b, which are the source of carrier gas, into the film-formation chamber 27 to replace the atmosphere in the film-formation chamber 27 with the carrier gas sufficiently. After the atmosphere in the film formation chamber 27 was sufficiently replaced with the carrier gas, the flow rate of the carrier gas from the carrier gas device 22a was regulated at 5.0 L/min, and the diluted carrier gas from the diluted carrier gas supply device 22b was regulated at 0.5 L/min. In this embodiment, oxygen was used as the carrier gas.

4. Formation of a Film

The ultrasonic transducer was then vibrated, and the vibration was propagated through the water 25a to the raw material solution 24a to atomize the raw material solution 24a to form atomized droplets. The atomized droplets were carried by the carrier gas and introduced in the film formation chamber 27. The atomized droplets was thermally reacted at 500° C. under atmospheric pressure in the film formation chamber 27 to form a film on the substrate 20. The film formation time was 1 hour and the film thickness was 20 nm.

Figure 2:
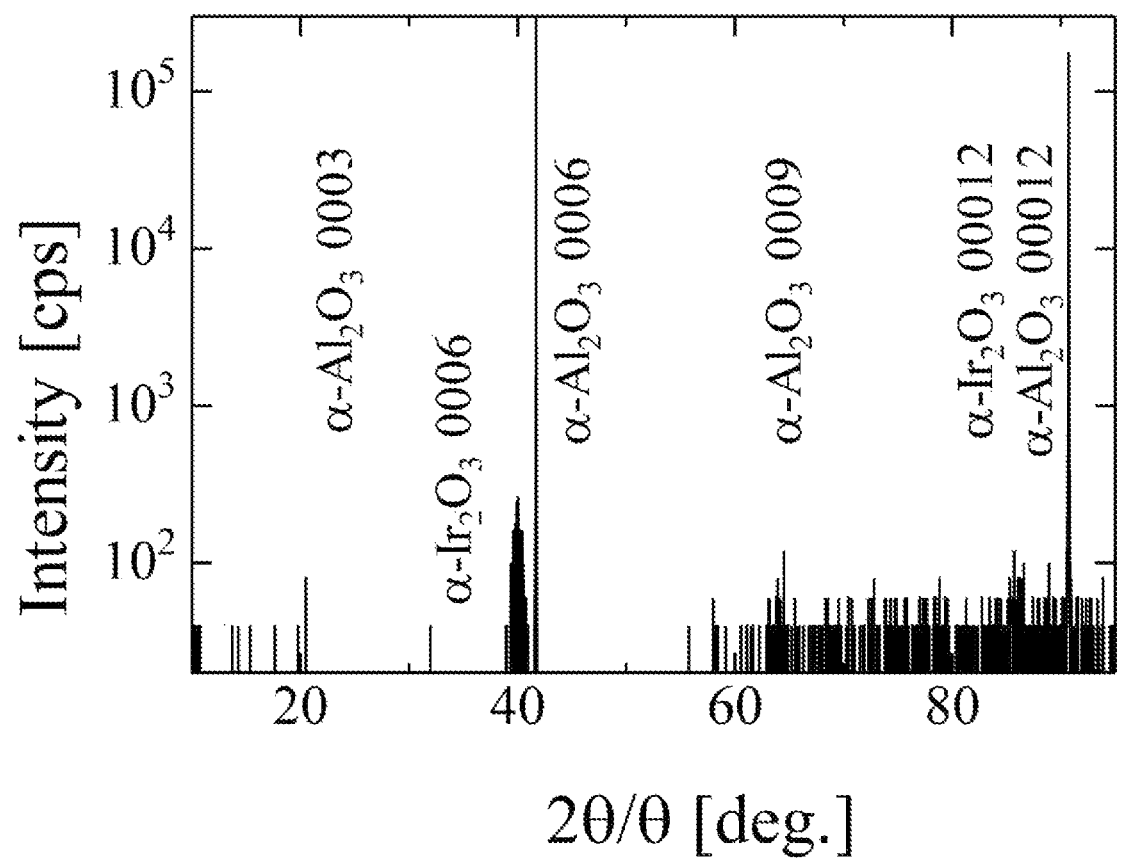
FIG. 2 shows a measurement result of an embodiment measured by an X-ray diffraction (XRD). The horizontal axis indicates an angle of diffraction (deg.) and the vertical axis indicates an intensity of diffraction (cps).

Using an X-ray diffraction (XRD) device, a phase of the film obtained at 4. Formation of a Film described above was identified as $\alpha$-$Ir_2O_3$. FIG. 2 shows the result of XRD. Also, Hall effect of the obtained $\alpha$-$Ir_2O_3$ film was measured and the $\alpha$-$Ir_2O_3$ film had an F value that was 0.997, The carrier type of the film was confirmed as p-type, carrier density of the film was $1.7 \times 10^{21}$ ($/cm^3$), and mobility of the film was 2.3 ($cm^2/Vs$). A band gap of the obtained $\alpha$-$Ir_2O_3$ film that was measured by a transmittance was 3.0 eV.

Figure 14:
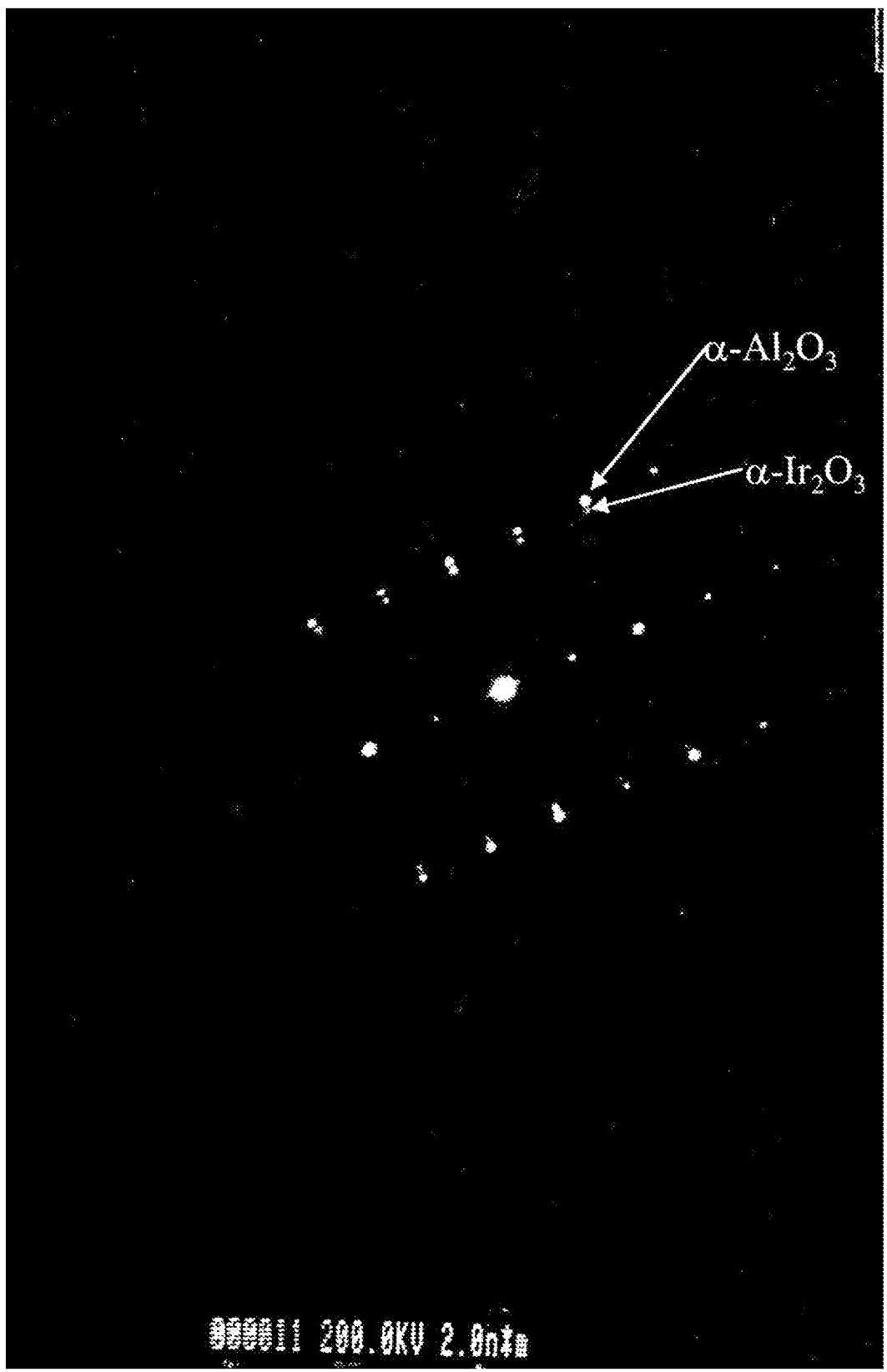
FIG. 14 shows a measurement result (electron beam diffraction image) of an embodiment measured by Transmission Electron Microscope (TEM).

An electron diffraction image of the $\alpha$-$Ir_2O_3$ film that was obtained at 4. Formation of a Film described above was taken using TEM analysis. FIG. 14 shows the electron diffraction image, and it is apparent from the electron diffraction image of FIG. 14, that the obtained $\alpha$-$Ir_2O_3$ film has a corundum structure that is the same structure as the structure of sapphire that was used as a substrate.

Reference Example

A lattice constant of $\alpha$-$Ir_2O_3$ was calculated using an experimental value of example I, and the difference in lattice constants between $\alpha$-$Ir_2O_3$ and $\alpha$-$Ga_2O_3$ was found to be 0.3%. This result shows that a crystal of $\alpha$-$Ga_2O_3$ is useful as to an oxide semiconductor of the n-type semiconductor, as a major component.

Example II

Figure 15:
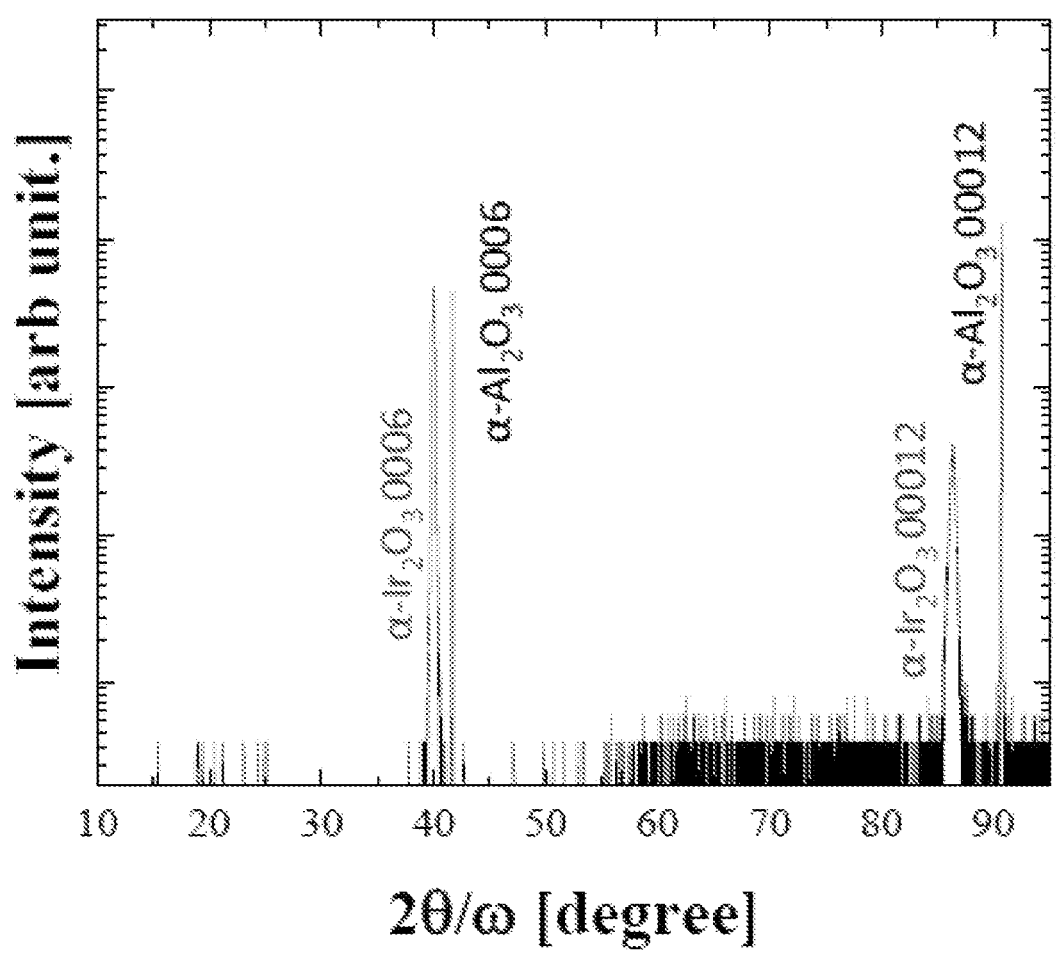
FIG. 15 shows a measurement result of an embodiment measured by XRD. The vertical axis indicates a diffraction angle (deg.) and the horizontal axis indicates an intensity of diffraction (arb.unit).

A film was obtained as Example II under the same conditions as the conditions of Example I except conditions; using an aqueous solution as a raw material solution that was prepared by adding hydrochloric acid into iridium chloride (III) with iridium concentration that is 0.05 mol/L such that hydrochloric acid is to be 20% at volume ratio; regulating the flow rate of carrier gas to be 1.0 L/min, the temperature for the film formation was set to be 1000° C., and the film formation time was 20 minutes. The obtained film at Example II was identified in the same manner as in Example I and found to be $\alpha$-$Ir_2O_3$. FIG. 15 shows the result of XRD. Also, the thickness of the obtained $\alpha$-$Ir_2O_3$ film was 2 μm.

Example III

A film was obtained as Example III under the same conditions as the conditions of Example I except four conditions: using an aqueous solution as a raw material solution that was prepared by mixing iridium chloride (III) with iridium concentration that is 0.02 mol/L and gallium chloride (III) with gallium concentration that is 0.02 mol/L, and hydrochloric acid was added to be 20% at volume ratio, regulating the flow rate of carrier gas to be 15 L/min, the temperature for film formation was set to be 750° C., and the film formation time was 20 minutes. The obtained film at Example III was identified in the same manner as in Example I and found to be $\alpha$-$(Ir_{0.95}Ga_{0.05})_2O_3$. The film thickness was 2 μm. Also, Hall effect of the obtained $\alpha$-$(Ir_{0.95}Ga_{0.05})_2O_3$ film was measured in the same manner as Example I and found to have an F value that was 0.905. The carrier type of the film was identified as p-type, carrier density of the film was $3.7 \times 10^{20}$ ($/cm^3$), and hole mobility of the film was 2.9 ($cm^2/Vs$).

Example IV

In order to confirm reproducibility, a film was obtained in Example IV, in the same manner as in Example III. The obtained film was identified in the same manner as in Example I and found to be $\alpha$-$(Ir_{0.95}Ga_{0.05})_2O_3$. Hall effect of the obtained $\alpha$-$(Ir_{0.95}Ga_{0.05})_2O_3$ film was measured in the same manner as in Example I and found that the film had an F value that was 0.927, carrier type of the film was defined as p-type, carrier density of the film was $2.0 \times 10^{20}$ ($/cm^3$), and hole mobility of the film was 5.8 ($cm^2/Vs$).

In order to confirm reproducibility, the film was obtained in the same manner as in Example III. The phase of the obtained film was identified in the same manner as in Example I to be $\alpha$-$(Ir_{0.95}Ga_{0.05})_2O_3$. Hall effect of obtained $\alpha$-$(Ir_{0.95}Ga_{0.05})_2O_3$ film was measured in the same manner as in Example I and revealed that F value was 0.927, carrier type of the film was defined as p-type, carrier density was $2.0 \times 10^{20}$ ($/cm^3$), and mobility of the film was 5.8 ($cm^2/Vs$).

INDUSTRIAL APPLICABILITY

A p-type oxide semiconductor of the present inventive subject matter is applicable as semiconductor devices (e.g, compound semiconductor devices) and electric components and electronic devices, optical and electronic photography related devices, and industrial parts. Since the p-type oxide semiconductor according to the present inventive subject matter has an enhanced p-type semiconductor property, the p-type oxide semiconductor is, in particular, applicable to semiconductor devices.

REFERENCE NUMBER DESCRIPTION

19 Mist CVD apparatus
20 a substrate
21 a susceptor
22a a carrier gas supply device
22b a dilution carrier gas supply device
23a a flow regulating valve
23b a flow regulating valve
24 a mist generator
25 a vessel
25a water
26 an ultrasonic transducer
27 a supply pipe
28 a heater
29 an air duct
40 a sub-collector layer
42 a collector layer
44 a base layer
46 an emitter layer
48 a cap layer
52 a collector electrode
54 a base electrode
56 an emitter electrode
60 a substrate
101a an $n^-$-type semiconductor layer
101b an $n^+$-type semiconductor layer
103 a metal layer
104 an insulating layer
105a a Schottky electrode
105b an Ohmic electrode
121a an n-type semiconductor layer with wide band gap
121b an n-type semiconductor layer with narrow band gap
121c an n+-type semiconductor layer
123 a p-type semiconductor layer 125a a gate electrode
125b a source electrode
125c a drain electrode
128 a buffer layer
129 a substrate
131a an n⁻-type semiconductor layer
131b a first n⁺-type semiconductor layer
131c a second n⁺-type semiconductor layer
132 a p-type semiconductor layer
134 a gate insulating film
135a a gate electrode
135b a source electrode
135c a drain electrode
138 a buffer layer
139 a semi-insulating layer
141a an n⁻-type semiconductor layer
141b a first n⁺-type semiconductor layer
141c a second n⁺-type semiconductor layer
142 a p-type semiconductor layer
145a a gate electrode
145b a source electrode
145c a drain electrode
151 an n-type semiconductor layer
151a an n⁻-type semiconductor layer
151b an n⁺-type semiconductor layer
152 a p-type semiconductor layer
154 a gate insulating layer
155a a gate electrode
155b an emitter electrode
155c a collector electrode
161 an n-type semiconductor layer
162 a p-type semiconductor layer
163 a light emitting diode
165a a first electrode
165b a second electrode
167 a translucent electrode
169 a substrate

What is claimed is:

1. A p-type oxide semiconductor comprising:
a crystalline oxide semiconductor as a major component, the crystalline oxide semiconductor comprising a crystal of a metal oxide that comprises iridium or the crystalline oxide semiconductor comprising a mixed crystal of a metal oxide that comprises iridium, and the crystalline oxide semiconductor having a corundum structure or a β-gallia structure.

2. The p-type oxide semiconductor according to claim 1, wherein the metal oxide comprises $Ir_2O_3$.

3. The p-type oxide semiconductor according to claim 1, wherein the crystalline oxide semiconductor comprises the mixed crystal of iridium and a metal selected from among a metal of Group 2 of the periodic table, a metal except iridium of Group 9 of the periodic table, and a metal of Group 13 of the periodic table.

4. A semiconductor device comprising:
a p-type semiconductor layer comprising a p-type oxide semiconductor including a crystalline oxide semiconductor as a major component, the crystalline oxide semiconductor comprising a crystal of a metal oxide that comprises iridium or the crystalline oxide semiconductor comprising a mixed crystal of a metal oxide that comprises iridium;
an electrode; and
an n-type semiconductor layer comprising an oxide semiconductor as a major component,
wherein a difference in lattice constants between the oxide semiconductor comprised as the major component in the n-type semiconductor layer and the p-type oxide semiconductor comprised in the p-type semiconductor layer is 1.0% or less.

5. The semiconductor device according to claim 4, wherein the n-type semiconductor layer comprises as the major component the oxide semiconductor comprising a metal of Group 2 of the periodic table, a metal of Group 9 of the periodic table, or a metal of Group 13 of the periodic table.

6. The semiconductor device according to claim 4, wherein the n-type semiconductor layer comprises as a major component a crystalline oxide semiconductor comprising gallium (Ga).

7. The semiconductor device according to claim 4, wherein the semiconductor device is a heterojunction bipolar transistor (HBT).

8. A semiconductor system comprising:
the semiconductor device according to claim 4.

* * * * *